United States Patent
Bednorz et al.

(10) Patent No.: US 8,983,796 B2
(45) Date of Patent: Mar. 17, 2015

(54) METHOD AND NETWORK ANALYZER FOR MEASURING GROUP RUNTIME IN A MEASURING OBJECT

(75) Inventors: Thilo Bednorz, Erding (DE); Steffen Neidhardt, Lengenfeld (DE)

(73) Assignee: Rohde & Schwarz GmbH & Co., KG, Munich (DE)

( * ) Notice: Subject to any disclaimer, the term of this patent is extended or adjusted under 35 U.S.C. 154(b) by 901 days.

(21) Appl. No.: 13/144,889

(22) PCT Filed: Jan. 15, 2010

(86) PCT No.: PCT/EP2010/000218
§ 371 (c)(1),
(2), (4) Date: Aug. 10, 2011

(87) PCT Pub. No.: WO2010/081725
PCT Pub. Date: Jul. 22, 2010

(65) Prior Publication Data
US 2011/0288820 A1    Nov. 24, 2011

(30) Foreign Application Priority Data

Jan. 15, 2009  (DE) .......................... 10 2009 004 727
Apr. 9, 2009   (DE) .......................... 10 2009 017 032
Jul. 29, 2009  (DE) .......................... 10 2009 035 179

(51) Int. Cl.
   G04F 1/00       (2006.01)
   G01R 23/20      (2006.01)
   G01R 27/28      (2006.01)

(52) U.S. Cl.
   CPC ................ *G01R 23/20* (2013.01); *H04B 3/462* (2013.01); *G01R 27/28* (2013.01)
   USPC ......................................... 702/176; 702/179

(58) Field of Classification Search
   CPC .......... G01R 23/20; G01R 27/28; H04B 3/462
   USPC .................................................. 702/176, 179
   See application file for complete search history.

(56) References Cited

U.S. PATENT DOCUMENTS 4,084,132 A * 4/1978 Fletcher et al. ............... 324/621
4,845,691 A * 7/1989 Itaya et al. ..................... 368/120

(Continued)

FOREIGN PATENT DOCUMENTS

EP    0 293 883 A1    12/1988
EP    1 515 147 A1     3/2005

OTHER PUBLICATIONS

Ebersberger, G. et al., "Television signal distortion in surface-wave filters and its measurement," EBU Review/technical, European Broadcasting Union, Brussels, Belgium, No. 221, Feb. 1987, pp. 21-30.

(Continued)

*Primary Examiner* — John Breene
*Assistant Examiner* — Stephanie Bloss
(74) *Attorney, Agent, or Firm* — Ditthavong & Steiner, P.C.

(57) ABSTRACT

A network analyzer for measuring a group delay time, which is caused by a device under test to be measured, generates an excitation signal comprising two signals $(x_{In1}(t), x_{In2}(t))$ spaced by a frequency difference, excites the device with the excitation signal and measures a response signal comprising two signals $(x_{Out1}(t), x_{Out2}(t))$, which are respectively phase distorted by the device relative to the signals $(x_{In1}(t), x_{In2}(t))$ of the excitation signal. It determines the phase difference $(\Delta\phi_{In})$ between the signals $(x_{In1}(t), x_{In2}(t))$ associated with the excitation signal and a phase difference $(\Delta\phi_{Out})$ between the signals $(x_{Out1}(t), x_{Out2}(t))$ associated with the response signal. Finally, it calculates the group delay time from the phase difference $(\Delta\phi_{In})$ of the signals $(x_{In1}(t), x_{In2}(t))$ associated with the excitation signal, the phase difference $(\Delta\phi_{Out})$ of the signals $(x_{Out1}(t), x_{Out2}(t))$ associated with the response signal and the frequency difference.

19 Claims, 8 Drawing Sheets

(56) References Cited

U.S. PATENT DOCUMENTS

| | | | |
|---|---|---|---|
| 6,046,595 | A | 4/2000 | Wardle |
| 6,529,844 | B1* | 3/2003 | Kapetanic et al. ............... 702/85 |
| 2003/0233599 | A1 | 12/2003 | Wu et al. |
| 2004/0239446 | A1* | 12/2004 | Gurvich et al. ............... 333/156 |
| 2006/0062574 | A1* | 3/2006 | Kido et al. ..................... 398/9 |
| 2007/0273389 | A1* | 11/2007 | Tan et al. ..................... 324/638 |
| 2008/0247491 | A1* | 10/2008 | Moulthrop et al. ........... 375/325 |

OTHER PUBLICATIONS

International Search Report, PCT/EP2010/000218, Jul. 16, 2010, pp. 1-8.

Jones, A. et al., "Measurement of Group Delay Using the 6840 series Microwave System Analyzer with Option 22," Application Note, Jan. 1, 2000, pp. 1-12.

Ostwald, O. "Group and Phase Delay Measurements with Vector Network Analyzer ZVR," Rohde & Schwarz GmbH & Go. KG, Application Note 1Ez35_1E, May 29, 1998, pp. 1-8.

English Translation of PCT International Preliminary Rerpot on Patentability for corresponding International Application No. PCT/EP2010/00218 dated Aug. 11, 2011, pp. 1-14.

PCT Notirication of Transmittal of Translation of the International Preliminary Report on Patent Ability (Chapter I or Chapter II) for corresponding International Application No. PCT/EP2010/00218, dated Aug. 11, 2011.

* cited by examiner

METHOD AND NETWORK ANALYZER FOR MEASURING GROUP RUNTIME IN A MEASURING OBJECT

CROSS-REFERENCE TO RELATED APPLICATION

The present application is a national phase application of PCT Application No. PCT/EP2010/000218, filed on Jan.15, 2010, and claims priority to German Patent Application No. DE 10 2009 004 727.1, filed on Jan. 15, 2009, German Patent Application No. DE 10 2009 017 032.4, filed on Apr. 9, 2009, and German Patent Application No. DE 10 2009 035 179.5, filed on Jul. 29, 2009, the entire contents of which are herein incorporated by reference.

BACKGROUND OF THE INVENTION

1. Field of the Invention

The invention relates to a method and a network analyzer for measuring the group delay time in a device under test.

2. Discussion of the Background

The linear transmission behaviour of an electronic component has to be determined for many fields of application. In this context, the phase distortion of the electronic component to be measured is also relevant in addition to the distortion of the amplitude. If the device under test—device-under-test (DUT)—is excited with a high-frequency excitation signal, a phase delay and accordingly a time delay, the so-called group delay time, can occur in the device under test. The group delay time $\tau_G$, which is relevant in the following description, is obtained according to equation (1) from the rate of change of the phase $\Delta\phi$ dependent upon the frequency $\Delta f$.

$$\tau_G = \frac{-1}{360°} \cdot \frac{\Delta\varphi}{\Delta f} \quad (1)$$

The particular problem with a group delay time measurement is the impact on the group delay time of additional influencing factors within the device under test which cannot be eliminated directly and which impair the quality of the measured result. These include primarily the phase-distorting effects of input and output lines of the device under test or, in the case of a frequency-converting device under test, the influences of an unknown, possibly even a drifting oscillator frequency of a local oscillator in a mixer on the group delay time of the device to be measured.

A method for determining the group delay time in an electronic component which compensates such unknown influences on the group delay time of the device under test, is known from EP 1 515 147 A1. In this context, the device under test is excited with an amplitude-modulated excitation signal, which originates from the modulation of a carrier realized as a Dirac comb with a purely sinusoidal modulation signal. The response signal measured periodically in the device under test after the excitation of the device under test with such an excitation signal over respectively constant time intervals using a transient recorder is transformed in a spectrum analyzer by means of a Fast Fourier transform into the spectral range. The phases are determined from the two spectral lines of the phase-distorted response signal disposed in the lower and upper sideband of the amplitude-modulated response signal in each case at the individual carrier frequencies of the Dirac comb. The group delay time with a given carrier frequency is obtained from the difference between the measured phases of the spectral lines of the response signal disposed in the upper and lower sideband with the respective carrier frequency minus double the phase of the modulation signal—equivalent to the phase difference between the spectral lines of the associated excitation signal disposed in the upper and lower sideband of the same carrier frequency—and scaled with the known frequency difference between the upper and lower sideband of the amplitude-modulated excitation signal and respective response signal.

The determination of the group delay time of a device under test according to EP 1 515 147 A1 disadvantageously requires a plurality of laboratory devices—signal generator, transient recorder, spectrum analyzer, synchronisation device—and, for the compensation of the unknown phase of the modulation signal, provides an additional calibration measurement at a reference-carrier frequency. In particular, the generation of the Dirac comb is cost intensive.

SUMMARY OF THE INVENTION

Embodiments of the invention therefore advantageously provide a system and a method with minimal equipment costs and method costs for determining the group delay time of the device under test, which allows the compensation of unknown, negative influencing factors internal to the device under test on the group delay time.

In order to reduce the equipment costs and method costs, a network analyzer, which provides the possibility of generating a harmonic dual-tone signal—two sinusoidal signals with a given frequency difference—as an excitation signal, and supplying this excitation signal, on one hand, via a first connection to the device under test for the excitation—forward wave $a_1$ towards the DUT—and, on the other hand, to a reference channel for a signal evaluation, is used according to the invention. At the same time, the response signal evoked by the device under test after excitation with the excitation signal—returning wave $b_2$ from the DUT—is supplied via a second connection to a measurement channel of the network analyzer.

In a first embodiment of the system according to the invention, the two sinusoidal signals of the excitation signal are mixed in each case via a mixer unit in the reference channel, and the two sinusoidal signals of the response signal are mixed in each case via a mixer unit in the measurement channel into an associated baseband signal, and the phase associated with each baseband signal is registered in a synchronous manner at the same timing point in each case via a detection unit. In a calculation unit, the group delay time is obtained from the phase difference of the two baseband signals associated with the response signal minus the phase difference of the two baseband signals associated with the excitation signal and through subsequent division by the frequency difference between the two harmonic signals of the excitation signal and the respective response signal. The measurement of the group delay time consequently corresponds to a phase determination of the forward transmission factor $S_{21}$ of the device under test $$S_{21} = \left.\frac{b_2}{a_1}\right|_{a_2=0}$$

and a subsequent scaling with the frequency difference between the two signals of the excitation signal and respective response signal.

As a result of the measurement according to the invention of the phase difference between the signals associated respectively with the excitation signal and simultaneously with the response signal, an additional time-consuming calibration measurement can be dispensed with. Moreover, the equipment costs are reduced according to the invention to only one network analyzer. As will be shown below in the description of the mathematical basis of the method according to the invention, the unknown oscillator frequency of the local oscillators contained in the mixer to be measured is compensated and accordingly has no influence on the result of the group delay time of the mixer to be determined.

In order to realize the mixing of the excitation signal and the response signal into the baseband in a digital manner, the high-frequency excitation signal and response signal is mixed into the intermediate-frequency band, in each case with the intermediate connection of an additional mixer in the reference channel and the measurement channel, and digitized respectively by a downstream analog-digital converter. In order to achieve an unambiguous signal evaluation, for example, only the lower side band signals of the two signals associated with the excitation signal and response signal generated in the respective additional mixer are used further, since the respective upper sideband signals are removed by means of filtering respectively in the reference channel and the measurement channel. It is, of course, also possible to proceed in the reverse manner.

The generation of the excitation signal realized as a dual-tone signal is implemented via two signal sources which generate the two signals of the excitation signal respectively. The combination of the two signals to form the excitation signal is implemented either via a high-frequency coupler or via a mixer in the form of an amplitude modulation. In a similar manner, the dual-tone excitation signal can also be generated via a frequency modulation or pulse modulation of a sinusoidal carrier. The signal generator can optionally also be realized outside the network analyzer.

In a second embodiment of the system according to the invention, the two sinusoidal signals of the excitation signal in the reference channel and the two sinusoidal signals of the response signal in the measurement channel are supplied, in each case after a mixing into the baseband or alternatively into the intermediate-frequency band and after an analog-digital conversion, in each case jointly to a Fast Fourier transformer, in which the phases of the two spectral lines of the excitation signal and respectively of the response signal, mixed into the baseband or intermediate-frequency band, are determined and supplied to a calculation unit for the measurement of the group delay time.

In a third embodiment of the system according to the invention, the mixing and measurement of the two sinusoidal signals of the excitation signal and of the two sinusoidal signals of the response signal into the intermediate-frequency band is implemented in each case in a sequential manner by controlling the associated mixers via a control unit, in each case in a sequential manner from a common local oscillator. The phase change occurring in the switchover phase of the common local oscillator between the reference-channel mixer and the measurement-channel mixer between the required carriers of the excitation signal and the respective response signal is compensated by the phase change taking place to the same extent in the two local oscillator signals, which are each supplied in a phase-coherent manner to the baseband mixer positioned in the reference channel and measurement channel.

In a fourth embodiment of the system according to the invention, in which a sequential intermediate-frequency band mixing of the two sinusoidal signals of the excitation signal and of the two sinusoidal signals of the response signal is implemented in a similar manner by a common local oscillator signal, the phase change of the excitation signal or respective response signal in the switching phase is compensated by a switching of a common local oscillator signal between the reference-channel and the measurement-channel baseband mixer, which runs in a synchronous manner to the switchover of the common local oscillator signal between the reference-channel and measuring-channel intermediate-frequency band mixer.

In a fifth embodiment of the system according to the invention, only a single, common measurement channel is used, which is embodied like the measurement channel and reference channel of the first embodiment of the invention. The two sinusoidal signals of the excitation signal are guided via a receiver control unit in a sequential manner relative to the two sinusoidal signals of the response signal in the common measurement channel.

In a sixth embodiment of the system according to the invention, the single, common measurement channel is embodied like the measurement channel or respectively the reference channel in the second embodiment of the invention.

Through integration of the accordingly determined group delay time via the frequency, a phase can be obtained as a function of the frequency, which is not unambiguously determinable because of the unknown integration constant. If a linearization is implemented for this generally non-linear, frequency-independent phase by determining an associated linear-regression straight line, a relative phase, which does not contain the ambiguity of the phase originally determined by integration because of the unknown integration constant, can be determined by subtraction of the non-linear phase from the linear phase.

BRIEF DESCRIPTION OF THE DRAWINGS

In the following section, the embodiments of the method and the system according to the invention for measuring the group delay time of a device under test with a network analyzer are explained in detail with reference to the drawings. The Figures in the drawings are as follows.

DETAILED DESCRIPTION OF EXEMPLARY EMBODIMENTS OF THE INVENTION

Figure 1A:
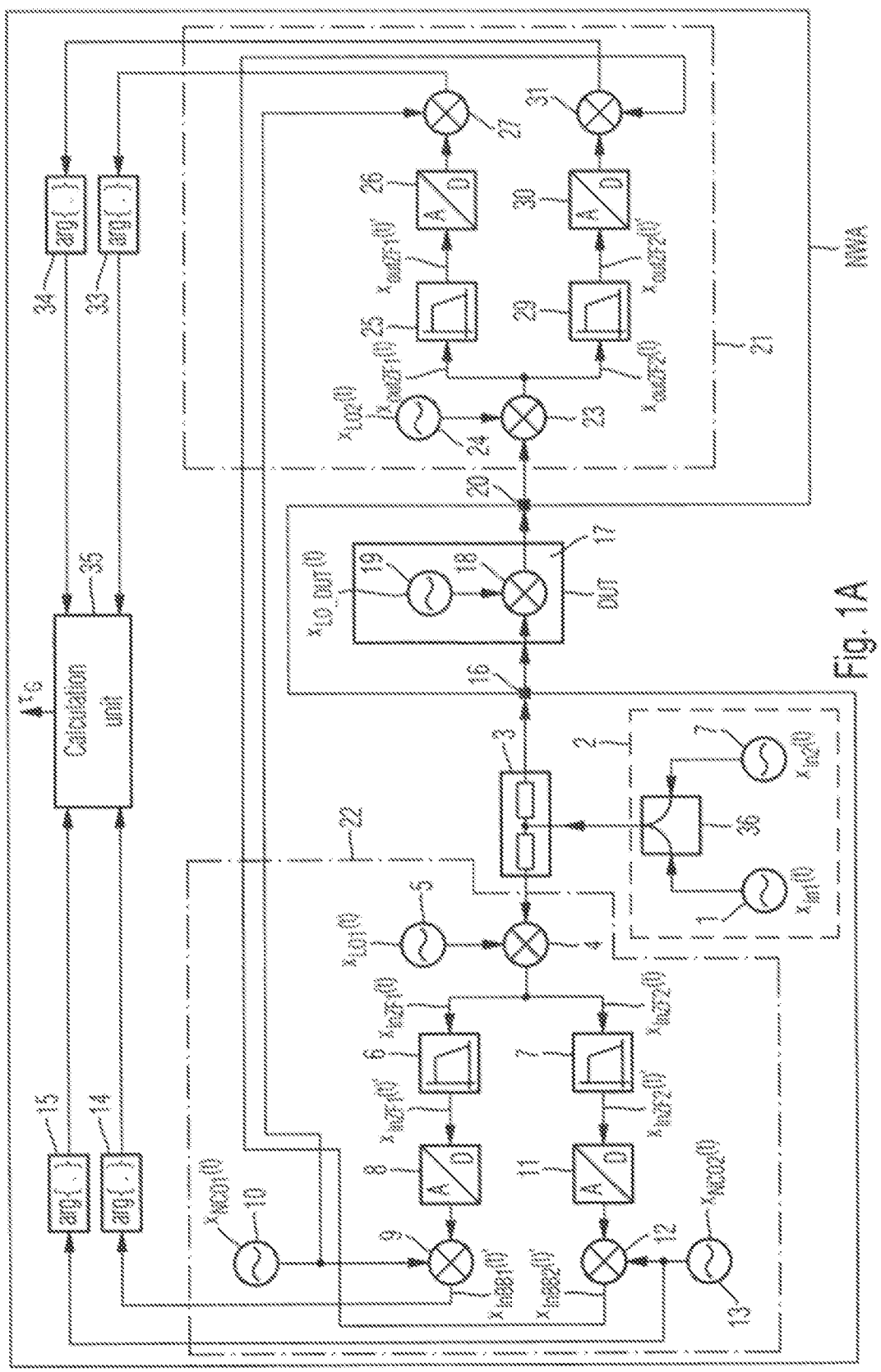
FIG. 1A shows a block-circuit diagram of a first embodiment of the system according to the invention for measuring the group delay time of a device under test with a network analyzer.
Figure 1B:
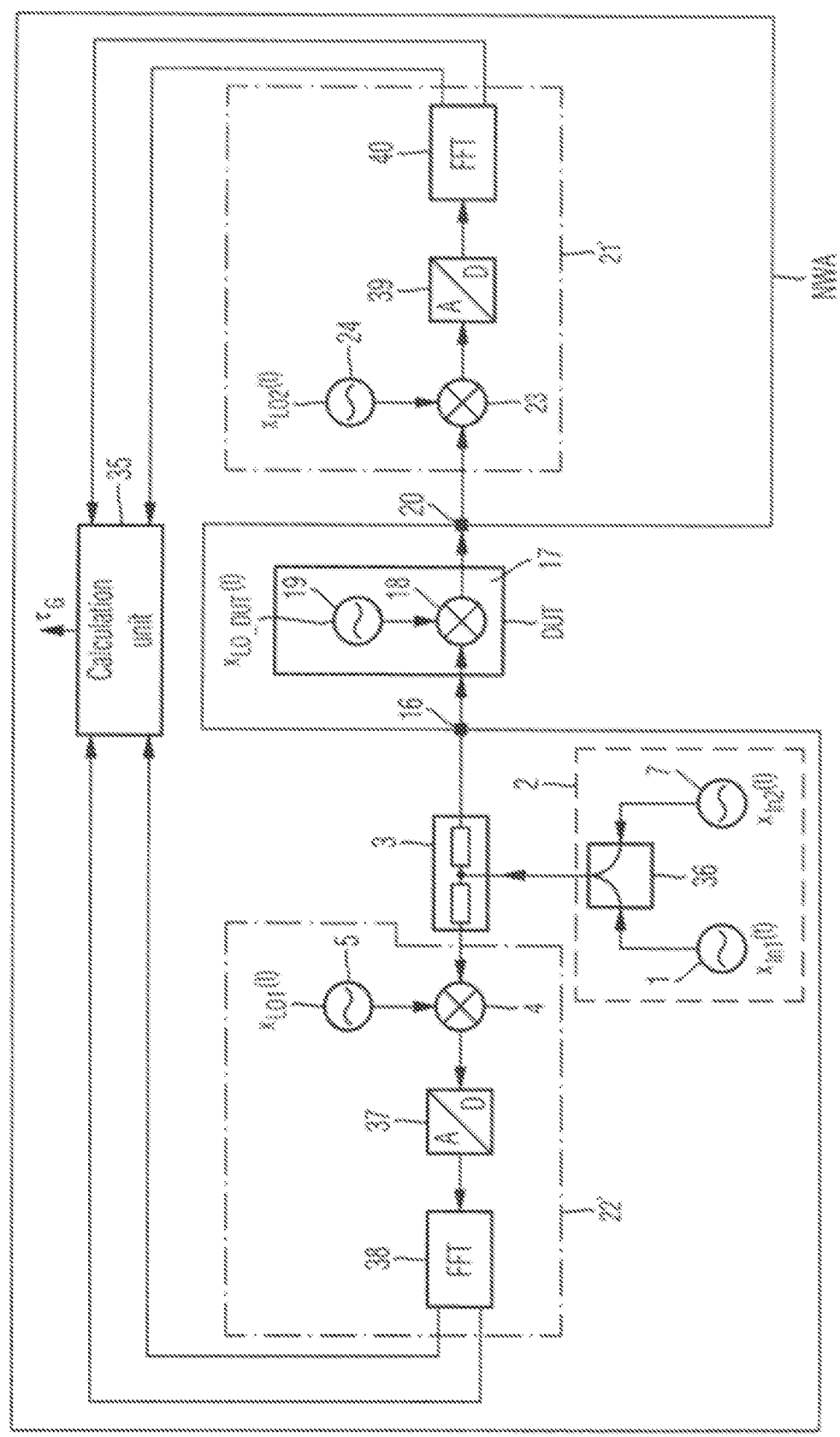
FIG. 1B shows a block-circuit diagram of a second embodiment of the system according to the invention for measuring the group delay time of a device under test with a network analyzer.
Figure 1C:
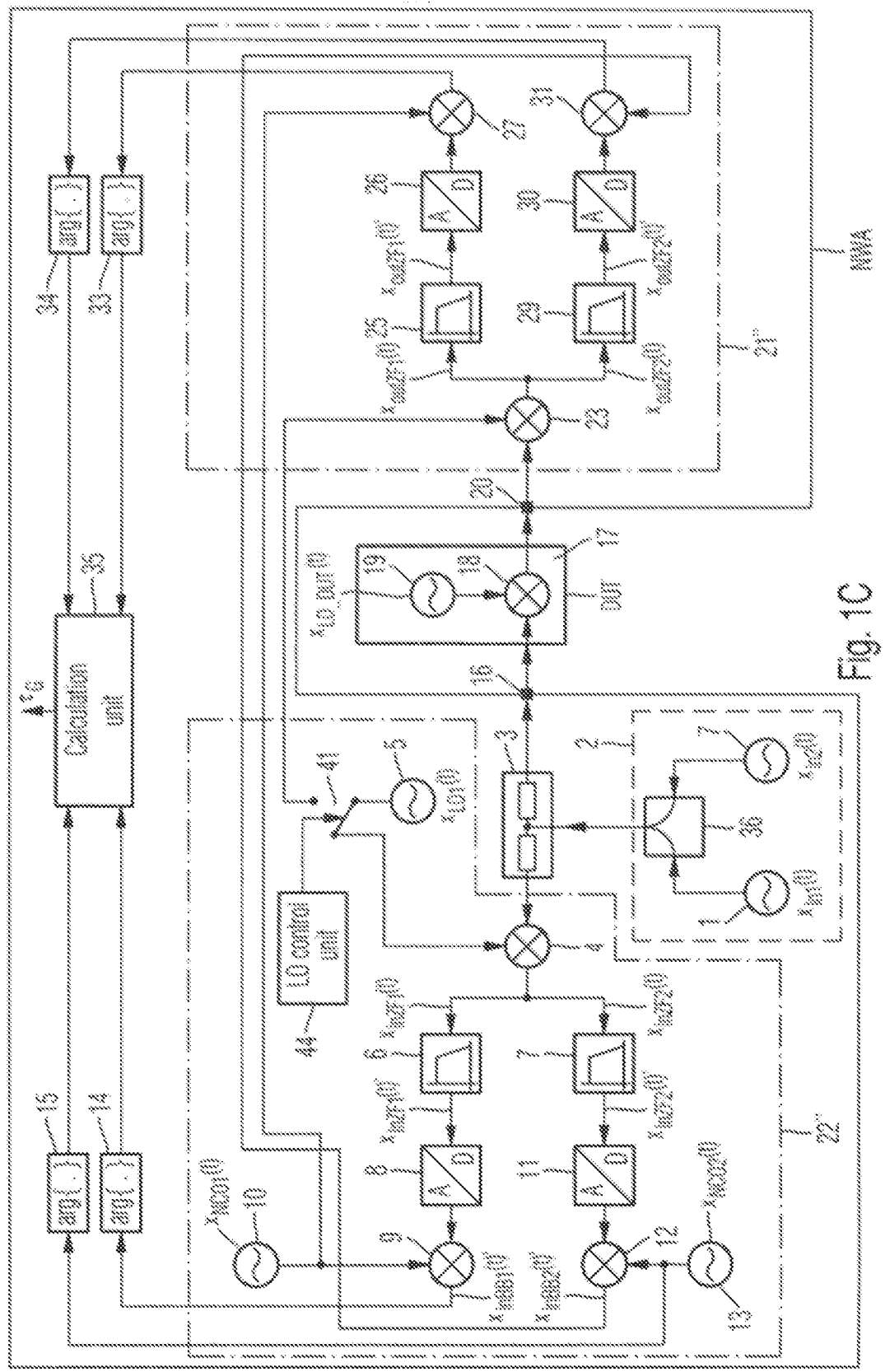
FIG. 1C shows a block-circuit diagram of a third embodiment of the system according to the invention for measuring the group delay time of a device under test with a network analyzer.
Figure 1D:
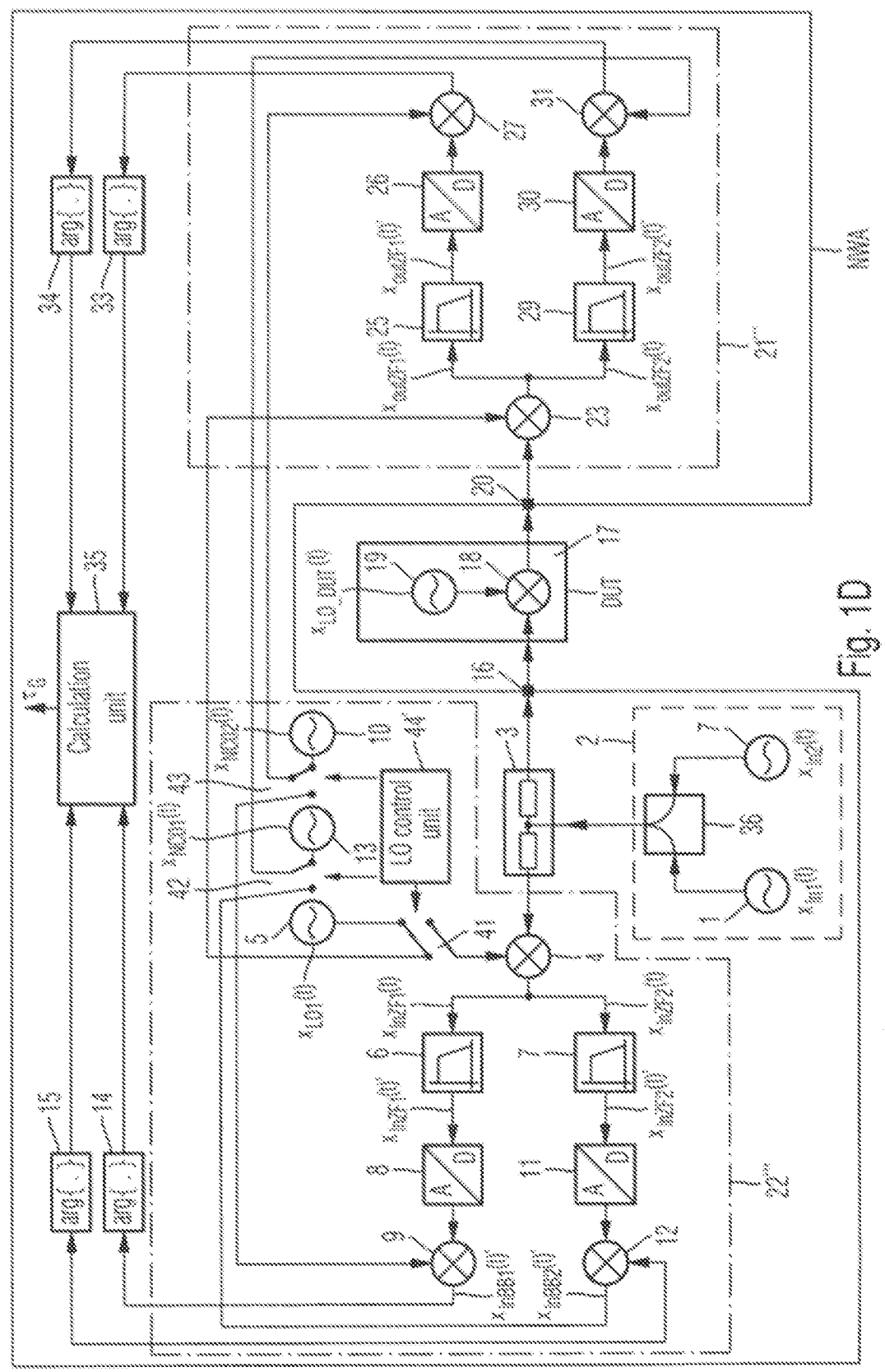
FIG. 1D shows a block-circuit diagram of a fourth embodiment of the system according to the invention for measuring the group delay time of a device under test with a network analyzer.
Figure 1E:
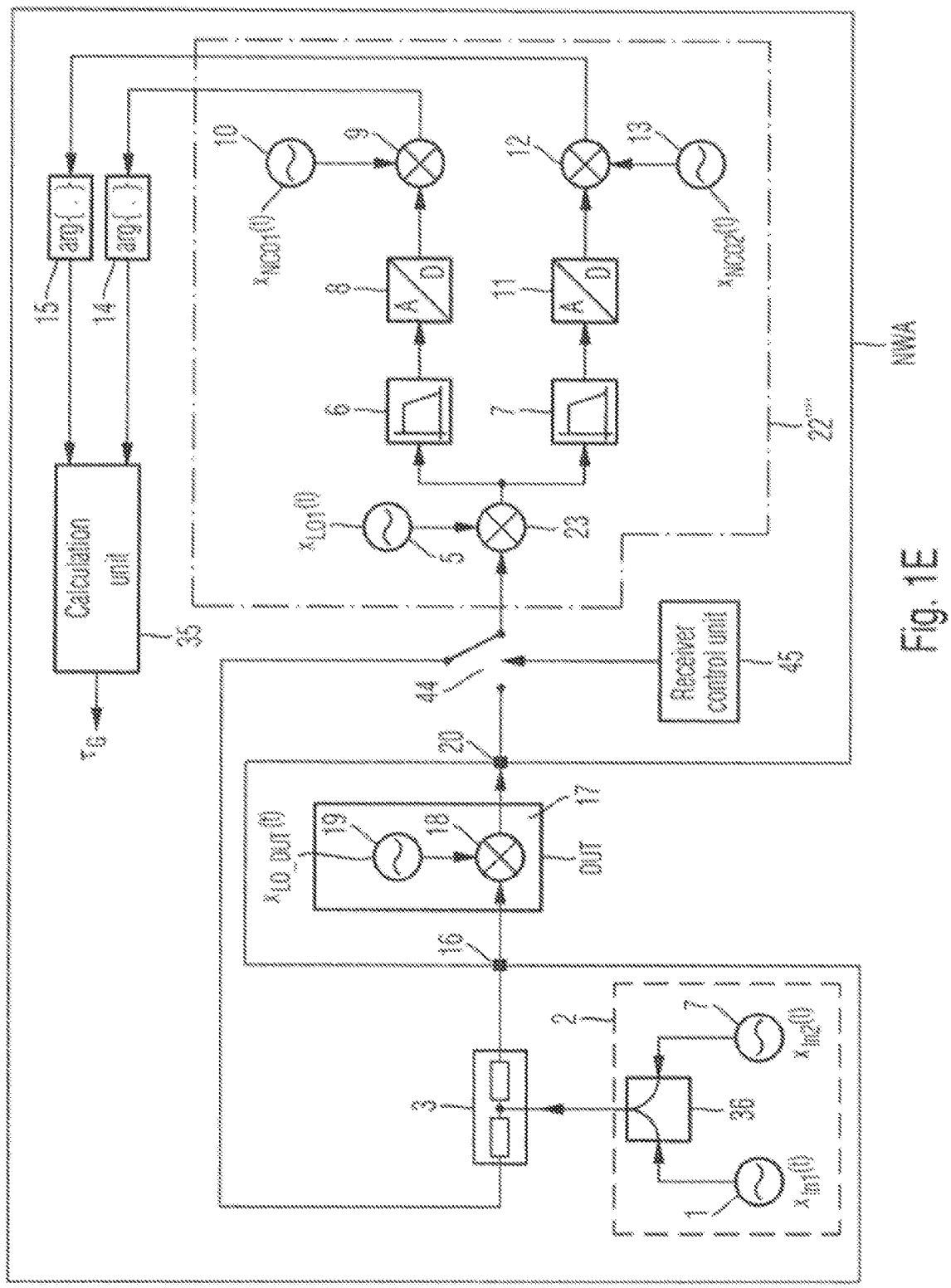
FIG. 1E shows a block-circuit diagram of a fifth embodiment of the system according to the invention for measuring the group delay time of a device under test with a network analyzer.
Figure 1F:
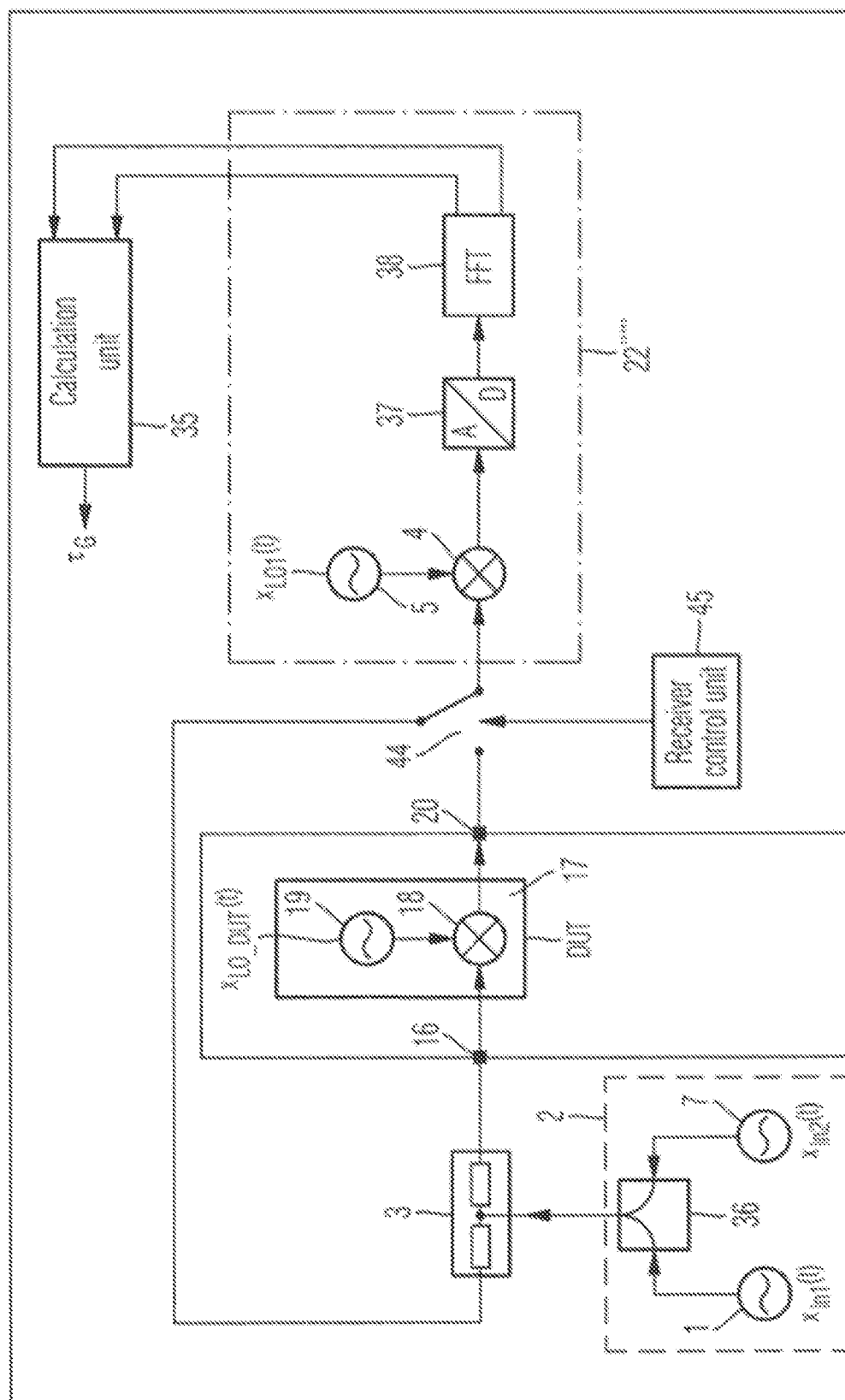
FIG. 1F shows a block-circuit diagram of a sixth embodiment of the system according to the invention for measuring the group delay time of a device under test with a network analyzer.
Figure 2A:
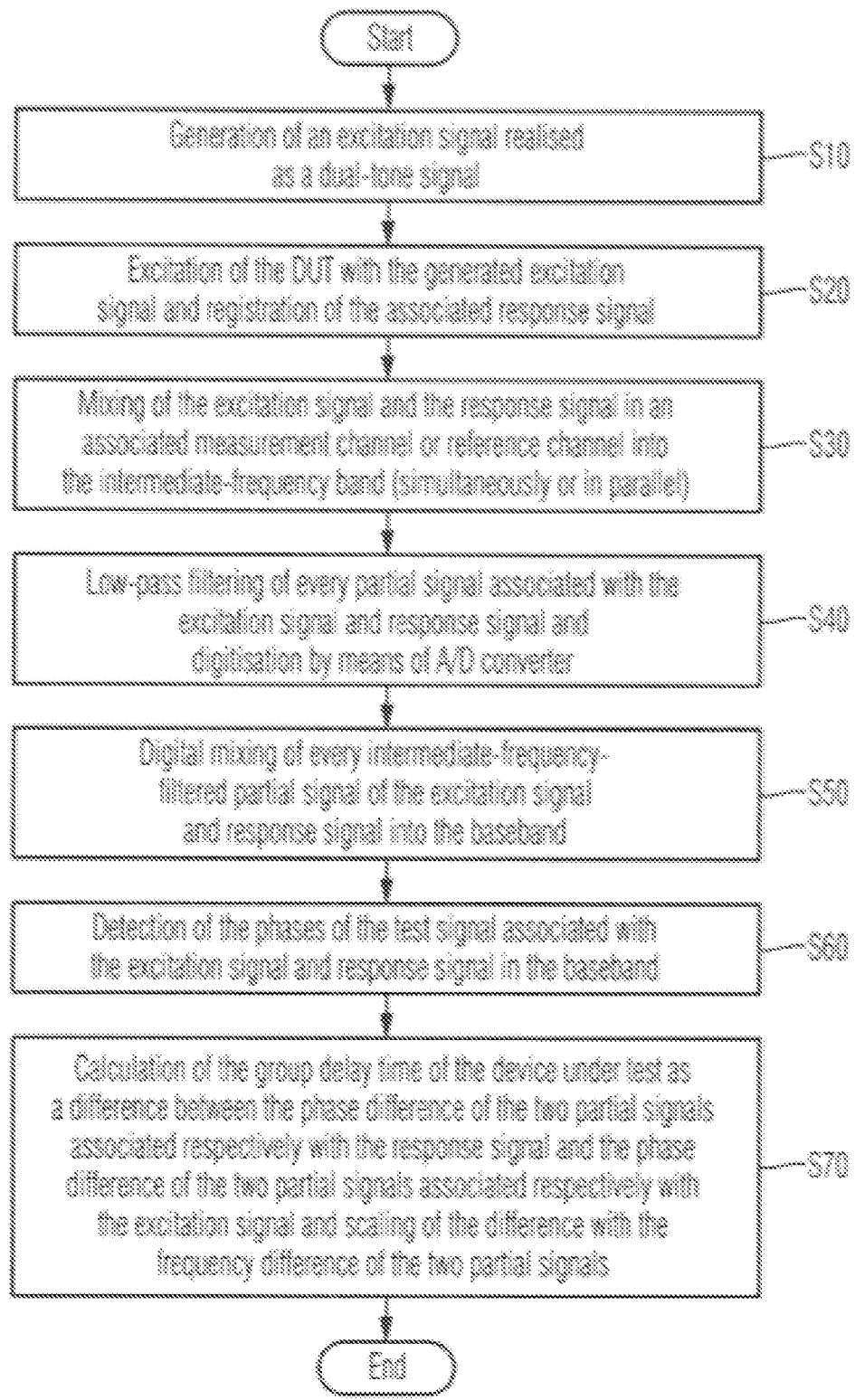
FIG. 2A shows a flow chart of a first embodiment of the method according to the invention for measuring the group delay time of a device under test with a network analyzer.
Figure 2B:
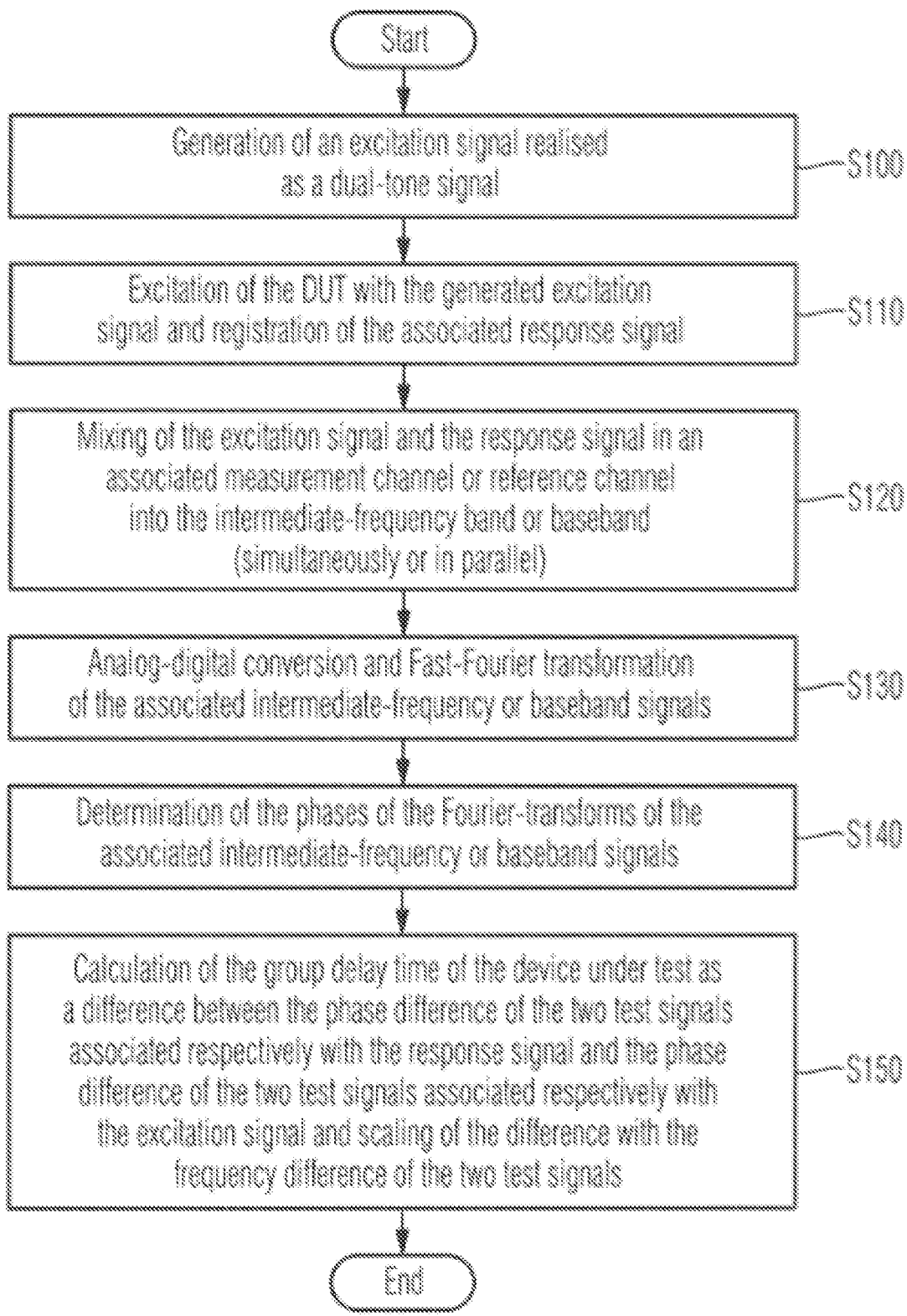
FIG. 2B shows a flow chart of a second embodiment of the method according to the invention for measuring the group delay time of a device under test with a network analyzer.

Before the two embodiments of the method according to the invention for measuring the group delay time $\tau_G$ of a device under test with a network analyzer (NWA) are described with a reference to FIGS. 2A and 2B, the mathematical basis necessary for an understanding of the invention will first be derived on the basis of the embodiments of the system for measuring the group delay time $\tau_G$ of a device under test with a network analyzer (NWA) according to the invention as presented in FIGS. 1A to 1F:

The signal $x_{In1}(t)$ of the excitation signal $x_{In}(t)$ generated in a first signal source 1 of the signal generator unit 2, which represents a high-frequency mono-tone signal $x_{In1HF1}(t)$, that is to say, a high-frequency, purely sinusoidal signal $x_{In1HF1}(t)$, is mixed according to Figure 1A, after a signal splitting in a signal splitter 3 corresponding to the first embodiment of the invention, in a first mixer 4 using a carrier signal $x_{Lo1}(t)$ generated in a local oscillator 5 according to equation (2), into a corresponding intermediate-frequency signal $x_{InZF1}(t)$. After an anti-aliasing filtering according to equation (3) in a low-pass filter 6, of which the threshold frequency is disposed between the frequency $\omega_{Lo1}-\omega_{In1}$ of the lower sideband and the frequency $\omega_{Lo1}+\omega_{In1}$ of the upper sideband of the resulting mixer product, a corresponding intermediate-frequency signal $x_{InZF1}(t)'$ with a signal in the lower sideband of the mixer product is generated.

$$x_{InZF1}(t)=x_{InHF1}(t)\cdot x_{Lo1}(t)=e^{\Delta j(\omega_{In1}\cdot t+\phi_{In1})}\cdot e^{-j(\omega_{Lo1}\cdot t+\phi_{Lo1})} \quad (2)$$

$$x_{InZF1}(t)'=e^{-j((\omega_{Lo1}-\omega_{In1})\cdot t+\phi_{Lo1}-\phi_{In1})} \quad (3)$$

In equations (2) and respectively (3), as in all of the following equations, the amplitudes of the signals are scaled to the value 1 in order to simplify the real signal relationships without limiting generality. Instead of the lower sideband of the mixer product, the upper sideband of the mixer product can also be used as an alternative and is also covered by the invention.

After the digitization of the intermediate-frequency signal $x_{InZF1}(t)'$, which corresponds to the high-frequency signal $x_{InHF1}(t)$ generated by the first signal source 1, in an analog-digital converter 8, a mixing of the intermediate-frequency signal $x_{InZF1}(t)'$ going back to the first signal source 1 into a corresponding baseband signal $x_{InBB1}(t)$ according to equating (4) is implemented in a digital mixer 9, with the assistance of a digitized carrier signal $x_{NCO1}(t)$ generated by a digital oscillator 10—numeric controlled oscillator (NCO), of which the frequency $\omega_{NCO1}$ corresponds to the intermediate-frequency signal $\omega_{Lo1}-\omega_{In1}$ going back to the first signal source 1. A baseband filter downstream of the digital mixer 9, which is not illustrated in FIG. 1, provides a mid-frequency of zero and is accordingly permeable only for the signal components of the baseband signal $x_{InBB1}(t)$ disposed in the lower sideband of the mixer product generated by the digital mixer 9. The filtered baseband signal $x_{InBB1}(t)'$ with a signal component at the frequency zero is obtained according to equating (5).

$$x_{InBB1}(t) = x_{InZF1}(t)\cdot x_{NCO1}(t) = \quad (4)$$
$$= e^{-j((\omega_{Lo1}-\omega_{In1})\cdot t+\phi_{Lo1}-\phi_{In1})}\cdot e^{-j(\omega_{NCO1}\cdot t+\phi_{NCO1})}$$

$$x_{InBB1}(t)' = e^{-j(\phi_{Lo1}-\phi_{In1}-\phi_{NCO1})} \quad (5)$$

In an equivalent manner, the signal $x_{In2}(t)$ of the excitation signal $x_{In}(t)$ generated in a second signal source 7 of the signal generator unit 2, which also represents a high-frequency, purely sinusoidal signal $x_{InHF2}(t)$, is mixed after a signal splitting in the first mixer 4 with the assistance of the carrier signal $x_{Lo1}(t)$ according to equation (6) into a corresponding intermediate-frequency signal $x_{InZF2}(t)$ and, after an anti-aliasing filtering according to equation (7) in a low-pass filter 7, of which the threshold frequency is disposed between the frequency $\omega_{Lo1}-\omega_{In2}$ of the lower sideband and the frequency $\omega_{Lo1}+\omega_{In2}$ of the upper sideband of the resulting mixer product, a corresponding intermediate-frequency signal $x_{InZF2}(t)'$ with a signal component in the lower sideband of the mixer product is generated.

$$x_{InZF2}(t)=x_{InHF2}(t)\cdot x_{Lo1}(t)=e^{\Delta j(\omega_{In2}\cdot t+\phi_{In2})}\cdot e^{-j(\omega_{Lo1}\cdot t+\phi_{Lo1})} \quad (6)$$

$$x_{InZF2}(t)'=e^{-j((\omega_{Lo1}-\omega_{In2})\cdot t+\phi_{Lo1}-\phi_{In2})} \quad (7)$$

After the digitization of the intermediate-frequency signal $x_{InZF2}(t)'$, which corresponds to the high-frequency signal $x_{InHF2}(t)$ generated by the second signal source 7, in an analog-digital converter 11, a mixing of the intermediate-frequency signal $x_{InZF2}(t)'$ going back to the second signal source 7 into a corresponding baseband signal $x_{InBB2}(t)$ according to equation (8) is implemented in a digital mixer 12 with the assistance of a digitized carrier signal $x_{NCO2}(t)$ generated in a digital oscillator 13, of which the frequency $\omega_{NCO2}$ corresponds to the frequency $\omega_{Lo1}-\omega_{In2}$ of the intermediate-frequency signal $x_{InZF2}(t)'$ going back to the second signal source 7. A baseband filter downstream of the digital mixer 12, which is not illustrated in FIG. 1, provides a mid-frequency of zero and is accordingly permeable only for the signal component of the baseband signal $x_{InBB2}(t)$ disposed in the lower sideband of the mixer product generated by the digital mixer 12. The filtered baseband signal $x_{InBB2}(t)'$ with a signal component at the frequency zero is obtained according to equation (9).

$$x_{InBB2}(t) = x_{InZF2}(t)\cdot x_{NCO2}(t) = \quad (8)$$
$$= e^{-j((\omega_{Lo1}-\omega_{In2})\cdot t+\phi_{Lo1}-\phi_{In2})}\cdot e^{-j(\omega_{NCO2}\cdot t+\phi_{NCO2})}$$

$$x_{InBB2}(t)' = e^{-j(\phi_{Lo1}-\phi_{In2}-\phi_{NCO2})} \quad (9)$$

Finally, according to equation (10) and respectively (11), the phases of the baseband-filtered excitation signal $x_{InBB1}(t)'$ going back to the first signal source 1 and of the baseband-filtered excitation signal $x_{InBB2}(t)'$ going back to the second signal source 7 are determined in the detector units 14 and 15 at the identical timing point $t_0$.

$$\arg\{x_{InBB1}(t_0)'\}=\phi_{Lo1}-\phi_{In1}-\phi_{NCO1} \quad (10)$$

$$\arg\{x_{InBB2}(t_0)'\}=\phi_{Lo1}-\phi_{In2}-\phi_{NCO2} \quad (11)$$

After being combined to form the high-frequency excitation signal $x_{InHF}(t)$, the two sinusoidal high-frequency signals $x_{InHF1}(t)$ and $x_{InHF2}(t)$ generated by the first and second signal source 1 and 7 are linked in a signal-linking unit 36 via the signal splitter 3 not only to a reference channel 22 of the network analyzer but also via a first connection 16 of the network analyzer (NWA) to the device under (DUT) 17. This device under test is preferably embodied as a frequency-converting unit. realized as a mixer unit 18, which is supplied by a local oscillator 19 with a carrier signal $x_{LO\_DUT}(t)$. The frequency-converting unit can, by comparison with the illustration in FIG. 1A, also comprise several cascaded mixer units.

The excitation signal $x_{InHF1}(t)$ guided to the input of the DUT 17 and generated by the signal source 1 is mixed with the carrier signal $x_{LO\_DUT}(t)$ of the local oscillator 19 associated with the device under test 17, of which the known oscillator frequency $\omega_{LO\_DUT}$ is composed, according to equation (12), of an unknown target frequency $\omega_{LO\_DUT\_Soll}$ and an unknown frequency drift $\Delta\omega'$ and experiences a phase distortion by the phase $\phi_{DUT1}$ in the device under test 17. The response signal $x_{OutHf1}(t)$ at the output of the device under test 17, which is evoked by the excitation signal $x_{InHf1}(t)$ generated by the first signal source 1, is obtained according to equation (13).

$$\omega_{LO\_DUT} = \omega_{LO\_DUT\_Soll} \pm \Delta\omega' \qquad (12)$$

$$x_{OutHf1}(t) = x_{InHF1}(t) \cdot x_{LO\_DUT}(t) \cdot e^{j\varphi_{DUT1}} = \qquad (13)$$
$$= e^{-j(\omega_{In1} \cdot t + \varphi_{In1})} \cdot e^{-j((\omega_{LO\_DUT\_Soll} \pm \Delta\omega')t + \varphi_{LO\_DUT})} \cdot$$
$$e^{j\varphi_{DUT1}}$$

In an equivalent manner, the excitation signal $x_{InHf2}(t)$ generated by the second signal source 7 is mixed with the carrier signal $x_{LO\_DUT}(t)$ of the local oscillator 19 associated with the device under test 17 and experiences a phase distortion by the phase $\phi_{DUT2}$ in the device under test 17. The response signal $x_{OUTHf2}(t)$ at the output of the device under test 17, which is evoked by the excitation signal $x_{InHf2}(t)$ generated by the second signal source 7, is obtained according to equation (14).

$$x_{OutHf2}(t) = x_{InHF2}(t) \cdot x_{LO\_DUT}(t) \cdot e^{j\varphi_{DUT2}} = \qquad (14)$$
$$= e^{-j(\omega_{In2} \cdot t + \varphi_{In2})} \cdot e^{-j((\omega_{LO\_DUT\_Soll} \pm \Delta\omega')t + \varphi_{LO\_DUT})} \cdot$$
$$e^{j\varphi_{DUT2}}$$

The two high-frequency signals $x_{OutHf1}(t)$ and $x_{OutHf2}(t)$ associated with the response signal $x_{OutHf}(t)$ are guided via the second connection 20 of the network analyzer within a measurement channel 21 of the network analyzer.

A low pass filter not illustrated in FIG. 1, of which the threshold frequency is disposed between the frequency $\omega_{LO\_DUT\_Soll}-\omega_{In1}$ the lower sideband and the frequency $\omega_{LO\_DUT\_Soll}+\omega_{In1}$ the upper sideband of the mixer product generated in the mixer 18 of the device under test 17 and going back to the excitation signal $x_{InHf1}(t)$ of the first signal source, and of which the bandwidth corresponds to double the maximal possible frequency drift $2\cdot\Delta\omega'$ of the local oscillator 19 in the device under test 17, generates a response signal $x_{OutHf1}(t)40$ according to equation (15), which is evoked by the excitation signal $x_{InHf1}(t)$ generated by the first signal source 1, and provides only a signal in the lower sideband of the mixer product generated by the mixer 18 of the device under test 17 and going back to the excitation signal $x_{InHf1}(t)$ of the signal source 1. A further low-pass filter also not illustrated in FIG. 1A, of which the threshold frequency is disposed between the frequency $\omega_{LO\_DUT\_Soll}-\omega_{In2}$ of the lower sideband and the frequency $\omega_{LO\_DUT\_Soll}+\omega_{In2}$ of the upper sideband of the mixer product generated in the mixer 18 of the device under test 17 and going back to the excitation signal $x_{InHf2}(t)$ of the second signal source 7 and of which the bandwidth corresponds to double the maximal possible frequency drift $2\cdot\Delta\omega'$ of the local oscillator 19 in the device under test 17, generates a response signal $x_{OutHf2}(t)'$ according to equation (16), which is evoked by the excitation signal $x_{InHf2}(t)$ generated by the second signal source 7 and provides only a signal in the lower sideband of the mixer product generated by the mixer 18 of the device under test 17 and going back to the excitation signal $x_{InHf2}(t)$ of the second signal source 7.

$$x_{OutHf1}(t)' = e^{-j((\omega_{LO\_DUT\_Soll} \pm \Delta\omega' - \omega_{In1})t + \varphi_{LO\_DUT} - \varphi_{In1} - \varphi_{DUT1})} \qquad (15)$$

$$x_{OutHf2}(t)' = e^{-j((\omega_{LO\_DUT\_Soll} \pm \Delta\omega' - \omega_{In2})t + \varphi_{LO\_DUT} - \varphi_{In2} - \varphi_{DUT2})} \qquad (16)$$

Following this, according to equation (18), the high-frequency response signal $xx_{OutHf1}(t)'$, which is evoked by the excitation signal $x_{InHf1}(t)$ generated in the first signal source 1, is mixed into an associated intermediate-frequency signal $x_{OutZF1}(t)$ via a mixer 23, which, by a local oscillator 24 with a carrier signal $x_{Lo2}(t)$, of which the carrier frequency $\omega_{Lo2}$ is obtained according to equation (17) from the difference between the oscillator target frequency $\omega_{LO\_DUT\_Soll}$ of the local oscillator 19 used in the device under test 17 and the frequency $\omega_{In1}$ of the high-frequency excitation signal $x_{InHF1}(t)$ generated by the first signal source 1—equivalent to the frequency of the high-frequency, low-pass filtered response signal $x_{OutHf1}(t)'$ after excitation with the excitation signal $x_{InHF1}(t)$ generated by the first signal source 1 and ignoring the frequency drift $\Delta\omega$ of the local oscillator 19 in the device under test 17—with the addition of the oscillator frequency $\omega_{NCO1}$ of a carrier signal $x_{NCO1}(t)$ supplied downstream within the measurement channel 21 to a digital mixer 27. Following this, according to equation (19) an anti-aliasing filtering is implemented in a downstream low-pass filter 25, of which the threshold frequency is disposed between the frequency $\omega_{Lo1}-(\omega_{LO\_DUT\_Soll}-\omega_{In1})=\omega_{NCO1}$ the lower sideband and the frequency $\omega_{Lo2}-(\omega_{LO\_DUT\_Soll}-\omega_{In1})$ of the upper sideband of the mixer product obtained in the mixer 23. The result of the anti-aliasing filtering is an associated intermediate-frequency signal $x_{OutZF1}(t)'$ with a harmonic in the lower sideband of the mixer product resulting in the mixer 23.

$$\omega_{Lo2} = \omega_{LO\_DUT\_Soll} - \omega_{In1} + \omega_{NCO1} \qquad (17)$$

$$x_{OutZF1}(t) = x_{OutHf1}(t) \cdot x_{Lo2}(t) = \qquad (18)$$
$$= e^{-j((\omega_{LO\_DUT\_Soll} \pm \Delta\omega' - \omega_{In1})t - \varphi_{In1} + \varphi_{LO\_DUT} - \varphi_{DUT1})} \cdot$$
$$e^{-j(\omega_{Lo2} \cdot t + \varphi_{Lo2})} =$$
$$= e^{-j((\omega_{LO\_DUT\_Soll} \pm \Delta\omega' - \omega_{In1})t - \varphi_{In1} + \varphi_{LO\_DUT} - \varphi_{DUT1})} \cdot$$
$$e^{-j((\omega_{LO\_DUT\_Soll} - \omega_{In1} + \omega_{NCO1})t + \varphi_{Lo2})}$$

$$x_{OutZF1}(t)' = \qquad (19)$$
$$e^{-j\left(\begin{array}{c}(\omega_{LO\_DUT\_Soll} - \omega_{In1} + \omega_{NCO1})-\\(\omega_{LO\_DUT\_Soll} \pm \Delta\omega' - \omega_{In1})\end{array}\right)t + \varphi_{In1} - \varphi_{LO\_DUT} + \varphi_{DUT1} + \varphi_{Lo2}} =$$
$$e^{-j((\omega_{NCO1} \pm \Delta\omega')t + \varphi_{In1} - \varphi_{LO\_DUT} + \varphi_{DUT1} + \varphi_{Lo2})}$$

In equivalent manner, the high-frequency low-pass-filtered response signal $x_{OutHf2}(t)'$, which is caused by the excitation signal $x_{InHf2}(t)$ generated in the second signal source 7, is mixed, according to equation (20), via the mixer 23, with the carrier signal $x_{Lo2}(t)$ with the identical carrier frequency $\omega_{Lo\_2}$ into an associated intermediate-frequency signal $x_{OutZF2}(t)$, according to equation (17). Following this, an anti-aliasing filtering is implemented in a downstream low-pass filter 29, of which the threshold frequency is disposed between the frequency $\omega_{Lo2}-(\omega_{LO\_DUT\_Soll}-\omega_{In2})=\omega_{In2}-\omega_{In1}+\omega_{NCO1}=\Delta\omega+\omega_{NCO1}=\omega_{NCO2}$ of the mixer product resulting in the lower sideband and the frequency $\omega_{Lo2}+(\omega_{LO\_DUT\_Soll}-\omega_{In2})$ of the mixer product resulting in the upper sideband in the mixer 23 or respectively of the oscillator frequency $\omega_{NCO2}$ of a carrier signal $x_{NCO2}(t)$ supplied downstream in the measurement channel 21 to a further mixer 31. According to equation (21), an associated intermediate-frequency signal $x_{OutZF2}(t)'$ is generated with a signal component in the lower sideband of the mixer product resulting in the mixer 23.

$$x_{OutZF2}(t) = x_{OutHf2}(t) \cdot x_{Lo2}(t) = \qquad (20)$$
$$= e^{-j((\omega_{LO\_DUT\_Soll} \pm \Delta\omega' - \omega_{In2})t - \varphi_{In1} + \varphi_{LO\_DUT} - \varphi_{DUT2})} \cdot$$
$$e^{-j(\omega_{Lo2} \cdot t + \varphi_{Lo2})} =$$
$$= e^{-j((\omega_{LO\_DUT\_Soll} \pm \Delta\omega' - \omega_{In2})t - \varphi_{In2} + \varphi_{LO\_DUT} - \varphi_{DUT2})} \cdot$$
$$e^{-j((\omega_{LO\_DUT\_Soll} - \omega_{In1} + \omega_{NCO1})t + \varphi_{Lo2})}$$

$$x_{OutZF2}(t)' == \qquad (21)$$
$$e^{-j\left(\binom{(\omega_{LO\_DUT\_Soll} - \omega_{In1} + \omega_{NCO1})-}{(\omega_{LO\_DUT\_Soll} \pm \Delta\omega' - \omega_{In2})}\right)t + \varphi_{In2} - \varphi_{LO\_DUT} + \varphi_{DUT2} + \varphi_{Lo2}} ==$$
$$e^{-j((\omega_{NCO1} \pm \Delta\omega' + \omega_{In2} - \omega_{In1})t + \varphi_{In2} - \varphi_{LO\_DUT} + \varphi_{DUT2} + \varphi_{Lo2})} ==$$
$$e^{-j((\omega_{NCO1} \pm \Delta\omega' + \Delta\omega)t + \varphi_{In2} - \varphi_{LO\_DUT} + \varphi_{DUT2} + \varphi_{Lo2})} ==$$
$$e^{-j((\omega_{NCO2} \pm \Delta\omega')t + \varphi_{In2} - \varphi_{LO\_DUT} + \varphi_{DUT2} + \varphi_{Lo2})}$$

The filtered intermediate-frequency signal $x_{OutZF1}(t)'$, which originates from an excitation of the DUT 17 with the excitation signal $x_{InHF1}(t)$ generated by the first signal source 1, is digitized in a downstream analog-digital converter 26 and mixed in a digital mixer 27, to which a carrier signal $x_{NCO1}(t)$ is supplied from the local oscillator 10, into an associated baseband signal $x_{OutBB1}(t)$, according to equation (22). A baseband filter, which is not illustrated in FIG. 1, downstream of the digital mixer 27 provides a mid-frequency of zero and is accordingly only permeable for the signal components of the baseband signal $x_{OutBB1}(t)$ disposed in the lower sideband of the mixer product generated by the digital mixer 21. The associated filtered baseband signal $x_{OutBB1}(t)'$ is obtained according to equation (23).

$$x_{OutBB1}(t) = x_{OutZF1}(t)' \cdot x_{NCO1}(t) = \qquad (22)$$
$$= e^{-j((\omega_{NCO1} \pm \Delta\omega')t - \varphi_{In1} + \varphi_{LO\_DUT} - \varphi_{DUT1} + \varphi_{Lo2})} \cdot$$
$$e^{-j(\omega_{NCO1} \cdot t + \varphi_{NCO1})} =$$

$$x_{OutBB1}(t)' = e^{-j(\pm\Delta\omega' \cdot t - \varphi_{In1} + \varphi_{LO\_DUT} - \varphi_{DUT1} + \varphi_{Lo2} - \varphi_{NCO1})} \qquad (23)$$

In an equivalent manner, the intermediate-frequency signal $x_{OutZF2}(t)'$, which originates from an excitation of the DUT 17 with the excitation signal $x_{InHF2}(t)$ generated by the second signal source 7, is digitized in a downstream analog-digital converter 30 and mixed in a digital mixer 31, to which a carrier signal $x_{NCO2}(t)$ is supplied from the local oscillator 13, into an associated baseband signal $x_{OutBB2}(t)$ according to equating (24). A baseband filter, which is not illustrated in FIG. 1, disposed downstream of the digital mixer 31 provides a mid-frequency of zero and is accordingly permeable only for the signal components of the baseband signal $x_{OutBB2}(t)$ disposed in the lower sideband of the mixer product generated by the digital mixer 31. The associated filtered baseband signal $x_{OutBB2}(t)'$ is obtained according to equation (25).

$$x_{OutBB2}(t) = x_{OutZF2}(t)' \cdot x_{NCO2}(t) = \qquad (24)$$
$$= e^{-j((\omega_{NCO2} \pm \Delta\omega')t - \varphi_{In2} + \varphi_{LO\_DUT} - \varphi_{DUT2} + \varphi_{Lo2})} \cdot$$
$$e^{-j(\omega_{NCO2} \cdot t + \varphi_{NCO2})} =$$

$$x_{OutBB2}(t)' = e^{-j(\pm\Delta\omega' \cdot t - \varphi_{In2} + \varphi_{LO\_DUT} - \varphi_{DUT2} + \varphi_{Lo2} - \varphi_{NCO2})} \qquad (25)$$

The digital mixers 9 and respectively 12 in the reference channel and the digital mixers 27 and respectively 31 in the measurement channel are started simultaneously and are in operation until the end of the sampling process of the two response signals in the intermediate-frequency band $X_{OutZF1}(t)'$ and $x_{OutZF2}(t)'$.

Finally, according to equation (26) and respectively (27), the phases of the baseband-filtered response signal $X_{OutBB1}(t)'$ going back to the first signal source 1 and of the baseband-filtered response signal $x_{OutBB2}(t)'$ going back to the second signal source 7 are determined in the detector units 33 and 34 at the identical timing point $t_0$.

$$\arg\{x_{OutBB1}(t_0)'\} = \pm\Delta\omega' \cdot t - \phi_{In1} + \phi_{LO\_DUT} - \phi_{DUT1} + \phi_{Lo2} - \phi_{NCO1} \qquad (26)$$

$$\arg\{x_{OutBB2}(t_0)'\} = \pm\Delta\omega' \cdot t - \phi_{In2} + \phi_{LO\_DUT} - \phi_{DUT2} + \phi_{Lo2} - \phi_{NCO2} \qquad (27)$$

In a calculation unit 35, according to equation (28), the phase difference $\Delta\phi_{In}$ between the phase $\arg\{x_{InBB1}(t_0)'\}$ of the baseband-filtered excitation signal $x_{InBB1}(t)'$ going back to the first signal source 1 and the phase $\arg\{x_{InBB2}(t_0)'\}$ of the baseband-filtered excitation signal $x_{InBB2}(t)'$ going back to the second signal source 7 and, according to equation (29), the phase difference $\Delta\phi_{Out}$ between the phase $\arg\{x_{OutBB1}(t_0)'\}$ of the baseband-filtered response signal $x_{OutBB1}(t)'$ going back to the first signal source 1 and the phase $\arg\{x_{OutBB2}(t_0)'\}$ of the baseband-filtered response signal $x_{OutBB2}(t)'$ going back to the second signal source 7, are calculated.

$$\Delta\varphi_{In} = \arg\{x_{InBB1}(t_0)'\} - \arg\{x_{InBB2}(t_0)'\} = \qquad (28)$$
$$= -\varphi_{In1} - \varphi_{NCO1} - (-\varphi_{In2} - \varphi_{NCO2})$$

$$\Delta\varphi_{Out} = \arg\{x_{OutBB1}(t_0)'\} - \arg\{x_{OutBB2}(t_0)'\} = \qquad (29)$$
$$= -\varphi_{In1} - \varphi_{DUT1} - \varphi_{NCO1} - (-\varphi_{In2} - \varphi_{DUT2} - \varphi_{NCO2})$$

Starting from the definition of the group delay time $\tau_G$ in equation (1), the group delay time $\tau_G$ according to equation (30) is obtained as the difference between the phase distortions $\phi_{DUT1} - \phi_{DUT2}$, which the two signal components contained in the excitation signal $x_{In}(t)$ experience within the device under test 17, which is scaled by the frequency difference $\Delta\omega$ between the two signal components.

$$\tau_G = \frac{-1}{360°} \cdot \frac{\Delta\varphi}{\Delta f} \qquad (30)$$
$$= \frac{-1}{360°} \cdot \frac{\Delta\varphi_{In} - \Delta\varphi_{Out}}{\Delta\omega} =$$
$$= \frac{-1}{360°} \cdot \frac{\varphi_{DUT1} - \varphi_{DUT2}}{\Delta\omega}$$

In a second embodiment of the invention, by analogy with the first embodiment of the invention, the signal $x_{In1}(t)$ of the excitation signal $x_{In}(t)$ generated in a first signal source 1 of the signal-generator unit 2, which is a high-frequency monotone signal $x_{InHF1}(t)$, is mixed, in a first mixer 4 with the assistance of a carrier signal $x_{Lo1}(t)$ generated by a local oscillator 5, into a signal $x_{InDown1}(t)$ in the intermediate-frequency band or baseband according to equation (3').

$$x_{InDown1}(t)' = e^{-j((\omega_{Lo1} - \omega_{In1})\cdot t + \phi_{Lo1} - \phi_{In1})} \quad (3')$$

In an equivalent manner, the signal $x_{In2}(t)$ of the excitation signal $x_{In}(t)$ generated in a second signal source 7 of the signal-generating unit 2, which also represents a high-frequency, purely sinusoidal signal $x_{InHF2}(t)$, is mixed in the first mixer 4 with the assistance of the carrier signal $x_{Lo1}(t)$ according to equation (7') into a corresponding signal $x_{InDown2}(t)$ in the intermediate-frequency band or baseband.

$$x_{InDown2}(t)' = e^{-j((\omega_{Lo1} - \omega_{In2})\cdot t + \phi_{Lo1} - \phi_{In2})} \quad (7')$$

After analog-digital conversion of the two intermediate-frequency (ZF) or baseband signals $x_{InDown1}(t)$ and $x_{InDown2}(t)$ in an analog-digital converter 37, the determination of the corresponding, complex spectral lines of the two intermediate-frequency or baseband signals $x_{InDown1}(t)$ and $x_{InDown2}(t)$ is implemented in a Fast Fourier transformer 38.

In the Fast Fourier transformer 38, the phases $\arg\{x_{InDown1}(t_0)\}$ and $\arg\{x_{InDown2}(t_0)\}$ of the complex spectral lines of the intermediate-frequency or baseband signals $x_{InDown1}(t)$ and $x_{InDown2}(t)$ associated with the excitation signal $x_{In}(t)$ are determined at the timing point $t_0$ according to equation (10') and (11').

$$\arg\{x_{InDown1}(t_0)\} = (\omega_{Lo1} - \omega_{In1})\cdot t_0 + \phi_{Lo1} - \phi_{In1} \quad (10')$$

$$\arg\{x_{InDown2}(t_0)\} = (\omega_{Lo1} - \omega_{In2})\cdot t_0 + \phi_{Lo1} - \phi_{In2} \quad (11')$$

By analogy with the first embodiment of the invention, the high-frequency response signal $x_{OutHf1}(t)'$ generated by the DUT 17 according to equation (15), which is evoked by the excitation signal $x_{InHf1}(t)$ generated in the first signal source, is mixed according to equation (19') in a mixer 23, which is supplied with a carrier signal $x_{Lo2}(t)$ from a local oscillator 24, into an associated signal $x_{OutDown1}(t)$ in the intermediate-frequency band or baseband.

$$x_{OutDown1}(t) = \quad (19')$$
$$e^{-j((\omega_{Lo2} - \omega_{In1} + \omega_{LO\_DUT\_Soll} \pm \Delta\omega')t - \varphi_{In1} + \varphi_{LO\_DUT} - \varphi_{DUT1} + \varphi_{Lo2})}$$

In an equivalent manner, the high-frequency band-pass-filtered response signal $x_{OutHf2}(t)'$ according to equation (16), which is evoked by the excitation signal $x_{InHf2}(t)$ generated in the second signal source 7, is mixed via the mixer 23 with the carrier signal $x_{Lo2}(t)$ into an associated signal $x_{OutDown2}(t)$ in the intermediate-frequency band or baseband according to equation (21').

$$x_{OutDown2}(t) = \quad (21')$$
$$e^{-j((\omega_{Lo2} - \omega_{In2} + \omega_{LO\_DUT\_Soll} \pm \Delta\omega')t - \varphi_{In2} + \varphi_{LO\_DUT} - \varphi_{DUT2} + \varphi_{Lo2})}$$

After analog-digital conversion of the two intermediate-frequency (ZF) or baseband signals $x_{OutDown1}(t)$ and $x_{OutDown2}(t)$ in an analog-digital converter 39, the determination of the corresponding complex spectral lines of the two intermediate-frequency or baseband signals $x_{OutDown1}(t)$ and $x_{OutDown2}(t)$ is implemented in a Fast Fourier transformer 40.

The analog-digital conversion in the analog-digital converter 39 starts at the same time as the analog-digital conversion in the analog-digital converter 37.

In the Fast Fourier transformer 40, the phases $\arg\{x_{OutDown1}(t_0)\}$ and $\arg\{x_{OutDown2}(t_0)\}$ of the complex spectral lines of the two intermediate-frequency or baseband signals $x_{OutDown1}(t)$ and $x_{OutDown2}(t)$ are determined at the synchronous timing point $t_0$ according to equation (26') and (27').

$$\arg\{x_{OutDown1}(t_0)\} = (\omega_{Lo2} - \omega_{In1} + \omega_{LO\_DUT\_Soll} \pm \Delta\omega')\cdot t_0 - \phi_{In1} + \phi_{LO\_DUT} - \phi_{DUT1} + \phi_{Lo2} \quad (26')$$

$$\arg\{x_{OutDown2}(t_0)\} = (\omega_{Lo2} - \omega_{In2} + \omega_{LO\_DUT\_Soll} \pm \Delta\omega')\cdot t_0 - \phi_{In2} + \phi_{LO\_DUT} - \phi_{DUT2} + \phi_{Lo2} \quad (27')$$

In the calculation unit 35, the phase difference $\Delta\phi_{In}$ between the phases $\arg\{x_{InDown1}(t_0)\}$ and $\arg\{x_{InDown2}(t_0)\}$ of the complex spectral lines of the two RF or baseband signals $x_{InDown1}(t)$ and $x_{InDown2}(t)$ associated with the excitation signal are determined at the timing point $t_0$ according to equation (28').

$$\Delta\phi_{In} = \arg\{x_{InDown1}(t_0)\} - \arg\{x_{InDown2}(t_0)\} = -\Delta\omega\cdot t_0 - \phi_{In1} + \phi_{In2} \quad (28')$$

In an equivalent manner, the phase difference $\Delta\phi_{Out}$ between the phases $\arg\{x_{OutDown1}(t_0)\}$ and $\arg\{x_{OutDown2}(t_0)\}$ of the complex spectral lines of the two intermediate-frequency or baseband signals $x_{OutDown1}(t)$ and $x_{OutDown2}(t)$ associated with the response signal are determined in the calculation unit 35 at the timing point $t_0$ according to equation (29').

$$\Delta\phi_{Out} = \arg\{x_{OutDown1}(t_0)\} - \arg\{x_{OutDown2}(t_0)\} = -\Delta\omega\cdot t_0 - \phi_{In1} + \phi_{In2} - \phi_{DUT1} + \phi_{DUT2} \quad (29')$$

By inserting the terms for the phase differences $\Delta\phi_{In}$ and $\Delta\phi_{Out}$ from equation (28') and (29') into equation (30) of the first embodiment of the invention, the same term is obtained for the group delay time $\tau_G$ of the second embodiment of the invention as in the case of the first embodiment of the invention.

In a second, third and fourth embodiment of the invention, after a mixing of the two sinusoidal signals of the excitation signal into the intermediate-frequency band through a common local oscillator 5 and a switchover duration $\Delta t$, the two sinusoidal signals of the response signal are mixed by the common local oscillator 5 into the intermediate-frequency band. As an alternative, the two sinusoidal signals of the response signal can first be mixed by the common local oscillator 5 into the intermediate-frequency band and, after a switchover duration $\Delta t$, the two sinusoidal signals of the excitation signal can be mixed into the intermediate-frequency band. If the group delay time $\tau_G$ is determined not only once, but continuously, the frequency of the common local oscillator 5 is switched in a cyclical manner with a switchover duration $\Delta t$ between the mixers 4 and 23 disposed in the measurement channel and in the reference channel.

In the following section, the case of the mixing of the two sinusoidal signals of the response signal following after the mixing of the two sinusoidal signals of the excitation signal is described. An equivalent mathematical derivation is obtained for each of the other cases.

For the intermediate-frequency signal $x_{OutZF1}(t+\Delta t)$ corresponding to the high-frequency, mono-tone signal $x_{OutHF1}(t)$ the response signal $x_{Out}(t)$ at the sampling time $t+\Delta t$, and for the intermediate-frequency signal $x_{OutZF2}(t+\Delta t)$ corresponding to the high-frequency, mono-tone signal $x_{OutHF2}(t)$ of the excitation signal $x_{Out}(t)$ at the sampling time $t+\Delta t$, the mathematical relationship in equations (18") and (20") is obtained.

$$x_{OutZF1}(t + \Delta t) = \qquad (18'')$$
$$e^{-j\left((+\omega_{LO\_DUT\_Soll} \pm \Delta\omega' - \omega_{In1})(t+\Delta t) - \varphi_{In1} + \varphi_{LO\_DUT} - \varphi_{DUT1}\right)} \cdot$$
$$e^{-j((\omega_{Lo1})(t+\Delta t) + \varphi_{Lo1})}$$

$$x_{OutZF2}(t) = e^{-j\left((+\omega_{LO\_DUT\_Soll} \pm \Delta\omega' - \omega_{In2})(t+\Delta t) - \varphi_{In2} + \varphi_{LO\_DUT} - \varphi_{DUT2}\right)} \cdot \qquad (20'')$$
$$e^{-j((\omega_{Lo1})(t+\Delta t) + \varphi_{Lo1})}$$

In anti-aliasing filters 25 and 29, the signal components $x_{OutZF1}(t)'$ and $x_{OutZF2}(t)'$ in the lower sidebands of the two intermediate-frequency signals and $x_{OutZF2}(t+\Delta t)$ are determined with reference to equation (19) and (21) in the first embodiment according to equation (19") and (21").

$$x_{OutZF1}(t)' = \qquad (19'')$$
$$e^{-j\left((\omega_{Lo1} - \omega_{LO\_DUT\_Soll} \pm \Delta\omega' - \omega_{In1})(t+\Delta t) + \varphi_{In1} - \varphi_{LO\_DUT} + \varphi_{DUT1} + \varphi_{Lo1}\right)}$$

$$x_{OutZF2}(t)' == \qquad (21'')$$
$$e^{-j\left((\omega_{Lo1} - \omega_{LO\_DUT\_Soll} \pm \Delta\omega' - \omega_{In2})(t+\Delta t) + \varphi_{In2} - \varphi_{LO\_DUT} + \varphi_{DUT2} + \varphi_{Lo1}\right)}$$

For the baseband signal $x_{OutBB1}(t+\Delta t)'$ corresponding to the high-frequency mono-tone signal $x_{OutHF1}(t)$ of the response signal $x_{Out}(t)$ at the sampling time t+Δt, and for the baseband signal $x_{OutBB2}(t+\Delta t)'$ corresponding to the high-frequency mono-tone signal $x_{OutHF2}(t)$ of the excitation signal $x_{Out}(t)$ at the sampling time t+Δt, subject to the condition that the phase of the two local oscillators 9 and 13 during the switchover duration Δt of the switches 41, 42, 43 and 44 also changes by Δt, and subject to the condition that $\omega_{NCO1}=\omega_{Lo1}-\omega_{LO\_DUT\_Soll}+\omega_{In1}$ and $\omega_{NCO2}=\omega_{Lo1}-\omega_{LO\_DUT\_Soll}+\omega_{In2}$ or respectively $\omega_{NCO1}-\omega_{NCO2}=\omega_{In1}-\omega_{In2}$ apply, the mathematical relationship in equation (22") and (23") or respectively (24") and (25") is obtained.

$$x_{OutBB1}(t + \Delta t) = x_{OutZF1}(t + \Delta t)' \cdot x_{NCO1}(t + \Delta t) == \qquad (22'')$$
$$e^{-j\left((\omega_{Lo1} - \omega_{LO\_DUT\_Soll} \pm \Delta\omega' + \omega_{In1})(t+\Delta t) - \varphi_{In1} + \varphi_{LO\_DUT} - \varphi_{DUT1} + \varphi_{Lo1}\right)}$$
$$\cdot e^{-j(\omega_{NCO1} \cdot (t+\Delta t) + \varphi_{NCO1})}$$

$$x_{OutBB1}(t + \Delta t)' = e^{-j\left((\pm\Delta\omega')(t+\Delta t) - \varphi_{In1} + \varphi_{LO\_DUT} - \varphi_{DUT1} + \varphi_{Lo1} - \varphi_{NCO1}\right)} \qquad (23'')$$

$$x_{OutBB2}(t + \Delta t) = x_{OutZF2}(t + \Delta t)' \cdot x_{NCO2}(t + \Delta t) == \qquad (24'')$$
$$e^{-j\left((\omega_{Lo1} - \omega_{LO\_DUT\_Soll} \pm \Delta\omega' + \omega_{In2})(t+\Delta t) - \varphi_{In2} + \varphi_{LO\_DUT} - \varphi_{DUT2} + \varphi_{Lo1}\right)}$$
$$\cdot e^{-j(\omega_{NCO2} \cdot (t+\Delta t) + \varphi_{NCO2})}$$

$$x_{OutBB2}(t + \Delta t)' = e^{-j\left((\pm\Delta\omega')(t+\Delta t) - \varphi_{In2} + \varphi_{LO\_DUT} - \varphi_{DUT2} + \varphi_{Lo1} - \varphi_{NCO2}\right)} \qquad (25'')$$

If the difference between the phases arg{$x_{OutBB1}(t+\Delta t)'$} and arg{$x_{OutBB2}(t+\Delta t)'$} of the two baseband signals $x_{OutBB1}(t+\Delta t)'$ and $x_{OutBB2}(t+\Delta t)'$ is taken, the same phase difference $\Delta\phi_{Out}$ is obtained as in the corresponding equation (29) for the first embodiment of the invention.

For the switchover of the local oscillator 5 with the local oscillator signal $x_{Lo1}(t)$ between the reference channel 22" and the measurement channel 21" via a switch 41, the third embodiment of the invention provides a local-oscillator control 44. Instead of a switch 41, a power splitter can also be used.

In a similar manner, for switching the local oscillator 5 with the local oscillator signal $x_{Lo1}(t)$ via a switch 41, for switching the local oscillator 13 with the local oscillator signal $x_{NCO1}(t)$ via the switch 42 and for switching the local oscillator 10 with the local oscillator signal $x_{NCO2}(t)$ via the switch 43 between the reference channel 22'''' and the measurement channel 21''', the fourth embodiment of the invention provides a local oscillator control 44'. The switches 42 and 43 can each be replaced by a power splitter as an alternative.

For switching the single measurement channel 2'''' of the network analyzer from the first connection 16 to the second connection 20, the fifth embodiment of the invention provides a switch 44, which is controlled from a receiver control 45.

It should be emphasised that in the fourth embodiment, by analogy with the third embodiment of the invention, the local oscillator 13 with the local oscillator signal $x_{NCO1}(t)$ must be adjusted between the oscillator frequency $\omega_{NCO1}=\omega_{Lo1}-\omega_{In1}$ after the connection of the excitation signal $x_{In}(t)$ and the oscillator frequency $\omega_{NCO1}=\omega_{Lo1}-\omega_{LO\_DUT\_Soll}+\omega_{In1}$ after the connection of the response signal $x_{Out}(t)$ to the common measurement channel 22'''', and the local oscillator 13 with the local oscillator signal $x_{NCO2}(t)$ must be adjusted between the oscillator frequency $\omega_{NCO2}=\omega_{Lo1}-\omega_{In2}$ after the connection of the excitation signal $x_{In}(t)$ and the oscillator frequency $\omega_{NCO2}=\omega_{Lo1}-\omega_{LO\_DUT\_Soll}+\omega_{In2}$ after the connection of the response signal $x_{Out}(t)$ to the common measurement channel 22''''.

The fifth embodiment of the invention represents a combination of the second and fourth embodiments of the invention. A mathematical derivation of the fifth embodiment of the invention is therefore not provided here.

Starting from the group delay time $\tau_G$ determined according to equation (30), the generally non-linear phase cp can be determined through integration of the group delay time according to equation (31).

$$\varphi = -360° \cdot \int_{f_a}^{f_e} \tau_G(f) df + C \qquad (31)$$

In numerical terms, the integration in equation (31) can be approximated by a sum according to equation (32).

$$\varphi(f_n) = \begin{cases} 0 & n = 1 \\ -360° \cdot \sum_{i=2}^{n} \dfrac{\tau_G(f_i) + \tau_G(f_{i-1})}{2} \cdot (f_i - f_{i-1}) & n \geq 2 \end{cases} \qquad (32)$$

Starting from this mathematical derivation for the group delay time $\tau_G$ which is evoked by a device under test 17, the first embodiment of the method according to the invention for measuring the group delay time $\tau_G$ in a device under test with a network analyzer will be described in the following section for the first, third, fourth and fifth embodiment of the system according to the invention with reference to the flow chart in FIG. 2A.

In the first method step S10, an excitation signal $x_{In}(t)$ which, as a dual-tone signal, comprises the two high-frequency sinusoidal signals $x_{InHF1}(t)$ and $x_{InHF2}(t)$ according to equation (2) and (6) with the frequency difference Δω, is generated in the signal-generating unit 2 of the network analyzer.

In the next method step S20, the excitation signal $x_{In}(t)$ is guided via a signal splitter 3 and a first connection 16 from the network analyzer and connected to the input of the frequency-converting device under test 17 for the excitation of the device under test 17. At the output of the device under test 17, the response signal $x_{Out}(t)$ evoked by the excitation signal $x_{In}(t)$ is measured by guiding it via a second connection 20 into a measurement channel 21 in the first embodiment of the system according to the invention, into a measurement channel 21" in the third embodiment of the system according to the invention, into a measurement channel 21'" in the fourth embodiment of the system according to the invention or via a switch 44 into a reference channel 22"" in the fifth embodiment of the system according to the invention.

Via the signal splitter 3, the generated excitation signal $x_{In}(t)$ is additionally supplied in a reference channel 22 in the first embodiment of the system according to the invention, in a reference channel 22" in the third embodiment of the system according to the invention, in a reference channel 22'" in a fourth embodiment of the system according invention or via a switch 44 in a reference channel 22"" in a fifth embodiment of the system according to the invention, to a mixer 4, in order to mix the two signals $x_{InHF1}(t)$ and $x_{InHF2}(t)$ according to equation (2) and (6) into the intermediate-frequency band, wherein the two intermediate-frequency signals $x_{InZF1}(t)$ and $x_{InZF2}(t)$ of the excitation signal $x_{In}(t)$ in the third, fourth and fifth embodiment of the system according to the invention are displaced in time by the switchover duration Δt as a result of the switching for the sequential measurement of excitation signal and response signal in every switchover cycle relative to the signals $x_{OutZF1}(t)$ and $x_{OutZF2}(t)$ of the response signal $x_{Out}(t)$.

In an equivalent manner, the two signal components $x_{outHf1}(t)$ and $x_{outHf2}(t)$ of the registered response signal $x_{out}(t)$ are mixed in a mixer 23 according to equation (18) and (20) into the intermediate-frequency band, wherein the intermediate-frequency signals $x_{OutZF1}(t)$ and $x_{OutZF2}(t)$ of the response signal $x_{Out}(t)$ in the third, fourth and fifth embodiment of the system according to the invention are displaced in time by the switchover duration Δt as a result of the switchover between excitation signal and response signal in every switchover cycle relative to the intermediate-frequency signals $x_{InZF1}(t)$ and $x_{InZF2}(t)$ of the excitation signal $x_{In}(t)$ according to equation (18") and (20").

In the next method step S40, the two intermediate-frequency signals $x_{InZF1}(t)$ and $x_{InZF2}(t)$ generated in the preceding method step, which go back to the excitation signal $x_{In}(t)$, are distributed to intermediate-frequency filters 6 and 7 realized as band-pass filters in each case on a signal path, and only the signal components (partial signals) $x_{InZF1}(t)'$ and $x_{InZF2}(t)'$ in the respective lower sideband of the generated mixer product is pursued further according to equation (6) and (7), wherein the signal components (partial signals) $x_{InZF1}(t)'$ and $x_{InZF2}(t)'$ associated with the excitation signal $x_{In}(t)$ in the third, fourth and fifth embodiment of the system according to the invention are displaced in time in every switchover cycle relative to the signal components (partial signals) $x_{OutZF1}(t)$ and $x_{OutZF2}(t)$ associated with the response signal $x_{Out}(t)$ by the switchover duration Δt. The intermediate-frequency signals $x_{OutZF1}(t)$ and $x_{OutZF2}(t)$, which go back to the response signal $x_{Out}(t)$, are also distributed to intermediate-frequency filters 25 and 29 realized as band-pass filters in each case on a signal path, and only the signal components $x_{OutZF1}(t)'$ and $x_{OutZF2}(t)'$ in the respective lower sideband of the generated mixer product are pursued further according to equation (19) and (21), wherein the intermediate-frequency signal components $x_{OutZF1}(t)'$ and $x_{OutZF2}(t)'$ associated with the response signal $x_{Out}(t)$ in the third, fourth and fifth embodiment of the system according to the invention are displaced in time by the switchover duration Δt according to equation (19") and (21") relative to the intermediate-frequency signal components $x_{InZF1}(t)'$ and $x_{InZF2}(t)'$ associated with the excitation signal $x_{In}(t)$ in every switchover cycle.

In the next method step S50, the intermediate-frequency filtered signal components $x_{InZF1}(t)'$ and $x_{InZF2}(t)'$, which go back to the excitation signal $x_{In}(t)$, are mixed in the digital mixers 9 and 13 into the baseband after their digitization in the analog-digital converters 6 and 7 according to equation (4) and (8), wherein the baseband-signal components $x_{InBB1}(t)$ and $x_{InBB2}(t)$ associated with the excitation signal $x_{In}(t)$ are displaced in time by the switchover duration Δt in every switchover cycle relative to the baseband-signal components $x_{OutBB1}(t)$ and $x_{OutBB2}(t)$ associated with the response signal $x_{Out}(t)$. Through a baseband filtering of the band-pass filters, which are not illustrated in FIG. 1, only the signal components $x_{InBB1}(t)'$ and $x_{InBB2}(t)'$ at the frequency zero—signal components in the lower sideband of the generated mixer products—are pursued further according to equation (5) and (9), wherein the baseband-signal components $x_{InBB1}(t)'$ and $x_{InBB2}(t)'$ associated with the excitation signal $x_{In}(t)$ and pursued further after the baseband filtering are displaced in time by the switchover duration Δt in every switchover cycle relative to the baseband-signal components $x_{OutBB1}(t)'$ and $x_{OutBB2}(t)'$ associated with the response signal $x_{Out}(t)$ and pursued further after the baseband filtering.

In an equivalent manner, the intermediate-frequency filtered signal components $x_{OutZF1}(t)'$ and $x_{OutZF2}(t)'$, which go back to the response signal $x_{Out}(t)$, are mixed into the baseband after their digitization in the analog-digital converters 26 and 30 according to equation (22) and (24), wherein the baseband-signal components $x_{OutBB1}(t)$ and $x_{OutBB2}(t)$ associated with the excitation signal $x_{Out}(t)$ is displaced in time by the switchover duration Δt in every switchover cycle relative to the baseband-signal components $x_{InBB1}(t)$ and $x_{InBB2}(t)$ associated with the response signal $x_{In}(t)$ according to equation (22") and (24").

Through a baseband filtering of the band-pass filters, which are not illustrated in FIGS. 1A, 1C, 1D and 1E, according to equation (23) and (25), only the partial signals $x_{OutBB1}(t)'$ and $x_{OutBB2}(t)'$ at the frequency zero—signal components in the lower sideband of the generated mixer products—are pursued further, wherein the baseband-signal components $x_{OutBB1}(t)'$ and $x_{OutBB2}(t)(t)'$ associated with the excitation signal $x_{Out}(t)$ and pursued further after the baseband filtering are displaced in time by the switchover duration Δt in every switchover cycle relative to the baseband-signal components $x_{InBB1}(t)'$ and $x_{InBB2}(t)'$ associated with the response signal $x_{In}(t)$ and pursued further after the baseband filtering according to equation (23") and (25").

In the next method step S60, the phases $\arg\{x_{InBB1}(t)'\}$ and respectively $\arg\{x_{InBB2}(t)'\}$ of the signal components $x_{InBB1}(t)'$ and $x_{InBB2}(t)'$ of the baseband signal at the frequency zero going back to the excitation signal $x_{In}(t)$ are determined according to equations (10) and (11) in the detector units 14 and 15, and the phases $\arg\{x_{OutBB1}(t)'\}$ and respectively $\arg\{x_{OutBB2}(t)'\}$ of the signal components $x_{OutBB1}(t)'$ and $x_{OutBB2}(t)'$ of the baseband signal going back to the response signal $x_{Out}(t)$ are determined according to equation (26) and (27) in the detector units 33 and 34. In the first embodiment of the system according to the invention, the detection of the phases $\arg\{x_{InBB1}(t)'\}$ and respectively $\arg\{x_{InBB2}(t)'\}$ of the signal components $x_{InBB1}(t)'$ and $x_{InBB2}(t)'$ of the [??] to the excitation signal $x_{In}(t)$ and of the phases $\arg\{x_{OutBB1}(t)'\}$ and respectively $\arg\{x_{OutBB2}(t)'\}$ of the signal components $x_{OutBB1}(t)'$ and $x_{OutBB2}(t)'$ of the response signal $x_{Out}(t)$ is implemented in a synchronous manner at the timing point $t_0$. In the third, fourth and fifth embodiment of the system according to the invention, the phases $\arg\{x_{InBB1}(t)'\}$ and respectively $\arg\{x_{InBB2}(t)'\}$ of the baseband-signal components $x_{InBB1}(t)'$ and $x_{InBB2}(t)'$ going back to the excitation signal $x_{In}(t)$ are detected in a synchronous manner at the timing point $t_0$, and the phases $\arg\{x_{OutBB1}(t)'\}$ and respectively $\arg\{x_{OutBB2}(t)'\}$ of the baseband-signal components $x_{OutBB1}(t)'$ and $x_{OutBB2}(t)(t)'$ going back to the response signal $x_{Out}(t)$ are detected in a synchronous manner at the timing point $t_0+\Delta t$.

In the final method step S70, the calculation of the group delay time $\tau_G$ which is evoked by the device under test 17 to be measured, is implemented in a calculation unit 35 of the network analyzer according to equation (30) from the difference of the phase differences $\Delta\phi_{In}$ and $\Delta\phi_{out}$, which are determined according to equation (28) from the phases $\arg\{x_{InBB1}(t_0)'\}$ and respectively $\arg\{x_{InBB2}(t_0)'\}$ of the signal components $x_{InBB1}(t)'$ and $x_{InBB2}(t)'$ of the baseband signal going back to the excitation signal $x_{In}(t)$, and according to equation (29), from the phases $\arg\{x_{OutBB1}(t_0)'\}$ and respectively $\arg\{x_{OutBB2}(t_0)'\}$ of the signal components $x_{OutBB1}(t)'$ and $x_{OutBB2}(t)'$ the baseband signal going back to the response signal $x_{Out}(t)$, in the case of the first embodiment of the system according to the invention, and from the phases $\arg\{x_{OutBB1}(t_0+\Delta t)'\}$ and respectively $\arg\{x_{OutBB2}(t_0+\Delta t)'\}$ of the signal components $x_{OutBB1}(t)'$ and $x_{OutBB2}(t)'$ of the baseband signal going back to the response signal $x_{Out}(t)$ in the case of the third, fourth and fifth embodiment of the system according to the invention, and by means of subsequent scaling with the frequency difference $\Delta\omega$ of the dual-tone signal.

In the following description, the second embodiment of the method according to the invention for measuring the group delay time $\tau_G$ in a device under test with a network analyzer is described for the second and sixth embodiment of the system according to the invention with reference to the flow chart in FIG. 2B:

The first three method steps S100, S110 and S120 in the second embodiment correspond to the first three method steps S10, S20 and S30 in the first embodiment. In method step S120, only the intermediate-frequency or respectively baseband signals $x_{InDown1}(t)$ and $x_{InDown2}(t)$ associated with the excitation signal $x_{In}(t)$ and the intermediate-frequency and baseband signals $x_{OutDown1}(t)$ and $x_{OutDown2}(t)$ according to equation (19') and (21') are determined according to equation (3') and (7'). In the second embodiment of the system according to the invention, the mixing of the high-frequency signal components $x_{InHF1}(t)$ and $x_{InHF2}(t)$ associated with the excitation signal $x_{In}(t)$ and of the high-frequency signals $x_{OutHF1}(t)$ and $x_{OutHF2}(t)$ associated with the response signal $x_{Out}(t)$ into the intermediate-frequency band or respectively the baseband is implemented in a mixer 4 associated with the reference channel 22', while the mixing of the high-frequency signals $x_{OutHF1}(t)$ and $x_{OutHF2}(t)$ associated with the response signal $x_{Out}(t)$ is implemented in a mixer 23 associated with the measurement channel 21'.

In the sixth embodiment of the system according to the invention, the mixing of the intermediate-frequency or respectively baseband signals $x_{InDown1}(t)$ and $x_{InDown2}(t)$ associated with the excitation signal $x_{In}(t)$ and of the high-frequency signals $x_{OutHF1}(t)$ and $x_{OutHF2}(t)$ associated with the response signal $x_{Out}(t)$ is implemented in a mixer 4 of the common measurement channel 22'''', wherein the cyclical connection of intermediate-frequency or respectively baseband signals $x_{InDown1}(t)$ and $x_{InDown2}(t)$ associated with the excitation signal $x_{In}(t)$ and of the high-frequency signals $x_{OutHF1}(t)$ and $x_{OutHF2}(t)$ associated with the response signal $x_{Out}(t)$ is implemented in the common measurement channel 22'''' by a switch 44 controlled by a receiver-control 45 with the switchover duration $\Delta t$.

In the next method step S130, the analog-digital conversion of the intermediate-frequency or respectively baseband signals $x_{InDown1}(t)$ and $x_{InDown2}(t)$ associated with the excitation signal $x_{In}(t)$ is implemented in an analog-digital converter 37 and of the intermediate-frequency or respectively baseband signals $x_{OutDown1}(t)$ and $x_{OutDown2}(t)$ associated with the response signal $x_{Out}(t)$ is implemented in an analog-digital converter 39 in the case of the second embodiment of the system according to the invention, and the analog-digital conversion of the intermediate-frequency or respectively baseband signals $x_{InDown1}(t)$ and $x_{InDown2}(t)$ associated with the excitation signal $x_{In}(t)$ and of the intermediate-frequency or respectively baseband signals $x_{OutDown1}(t)$ and $x_{OutDown2}(t)$ associated with the response signal $x_{Out}(t)$ is implemented in the common analog-digital converter 37 in the case of the sixth embodiment of the system according to the invention.

Following this, the Fast Fourier transformation of the intermediate-frequency or respectively baseband signals $x_{InDown1}(t)$ and $x_{InDown2}(t)$ associated with the excitation signal $x_{In}(t)$ is implemented in a Fourier transformer 38 of the reference channel 22', and of the intermediate-frequency or respectively baseband signals $x_{OutDown1}(t)$ and $x_{OutDown2}(t)$ associated with the response signal $x_{Out}(t)$ is implemented in a Fourier transformer 40 of the measurement channel 21' in the case of the second embodiment of the system according to the invention. In the case of the sixth embodiment of the system according to the invention, the Fast Fourier transformation of the intermediate-frequency or respectively baseband signals $x_{InDown1}(t)$ and $x_{InDown2}(t)$ associated with the excitation signal $x_{In}(t)$ and of the intermediate-frequency or respectively baseband signals $x_{OutDown1}(t)$ and $x_{OutDown2}(t)$ associated with the response signal $x_{Out}(t)$ is implemented in the common Fourier transformer 38 of the measurement channel 22''''.

In the next method step S140, in the case of the second embodiment of the system according to the invention, the phases $\arg\{x_{InDown1}(t_0)\}$ and $\arg\{x_{InDown2}(t_0)\}$ of the complex spectral lines of the two intermediate-frequency or respectively baseband signals $x_{InDown1}(t)$ and $x_{InDown2}(t)$ associated with the excitation signal $x_{In}(t)$ according to equation (10') and (11') are determined in a synchronous manner at the timing point $t_0$, and the phases $\arg\{x_{OutDown1}(t_0)\}$ and $\arg\{x_{OutDown2}(t_0)\}$ of the complex spectral lines of the two intermediate-frequency or respectively baseband signals $x_{OutDown1}(t)$ and $x_{OutDown2}(t)$ associated with the response signal $x_{Out}(t)$ are determined in a synchronous manner at the timing point $t_0$ according to equation (26') and (27'). In the case of the sixth embodiment of the system according to the invention, the phases $\arg\{x_{InDown1}(t_0)\}$ and $\arg\{x_{InDown2}(t_0)\}$ of the complex spectral lines of the two intermediate-frequency or respectively baseband signals $x_{InDown1}(t)$ and $x_{InDown2}(t)$ associated with the excitation signal $x_{In}(t)$ are determined in a synchronous manner at a timing point $t_0$, and the phases $\arg\{x_{OutDown1}(t_0+\Delta t)\}$ and $\arg\{x_{OutDown2}(t_0+\Delta t)\}$ of the complex spectral lines of the two intermediate-frequency or respectively baseband signals $x_{OutDown1}(t)$ and $x_{OutDown2}(t)$ associated with the response signal $x_{Out}(t)$ are determined in a synchronous manner at a timing point $t_0+\Delta t$.

The concluding method step S150, in which the excitation-end and the response-end phase differences and finally the group delay time $\tau_G$ are calculated, corresponds to method step S70 in the first embodiment.

Optionally, a generally non-linear phase cp of the DUT can be calculated according to equation (32) from the determined group delay time $\tau_G$ of the DUT. Through linear regression, a linearized phase is determined from the generally non-linear phase $\phi$. A relative phase $\phi_R$, which does not provide the inaccuracy of the generally non-linear phase φ because of the unknown integration constant, is obtained through subtraction of the generally non-linear phase φ and the associated linearized phase.

The invention is not restricted to the presented embodiments of the system according to the invention and of the method according to the invention for measuring the group delay time of a device under test using a network analyzer. In particular, a realization is also covered by the invention, in which the excitation signal and the response signal are mixed directly from the high-frequency band into the baseband, bypassing the intermediate-frequency band. The case of four local mixers operating in a phase-coherent manner for mixing the test signals associated respectively with the excitation signal and the response signal into the baseband is also covered by the invention. Finally, the case that the two high-frequency signals $x_{InHF1}(t)$ and $x_{InHF2}(t)$ differ with regard to amplitude and phase is also covered by the invention.

The invention claimed is:

1. A method for measuring a group delay time ($\tau_G$), which is caused by a device under test to be measured, with the use of a network analyzer, comprising the following methods steps:

generating within the network analyzer of an excitation signal ($x_{In}(t)$) comprising two signals ($x_{In1}(t)$, $x_{In2}(t)$), which are spaced with a frequency difference ($\Delta\omega$) relative to one another;

exciting of the device under test with the excitation signal ($x_{In}(t)$) and measurement by the network analyzer of a response signal ($x_{Out}(t)$) comprising two signals ($x_{Out1}(t)$, $x_{Out2}(t)$), which are each phase-distorted by the device under test relative to the signals ($x_{In1}(t)x_{In2}(t)$) of the excitation signal ($x_{In}(t)$);

determining of a phase difference ($\Delta\phi_{In}$) between the signals ($x_{In1}(t)$, $x_{In2}(t)$) associated with the excitation signal ($x_{In}(t)$) and a phase difference ($\Delta\phi_{Out}$) between the signals ($x_{Out1}(t)x_{Out2}(t)$) associated with the response signal ($x_{Out}(t)$); and calculating of the group delay time ($\tau_G$) from the phase difference ($\Delta\phi_{In}$) of the signals ($x_{In1}(t)$, $x_{In2}(t)$) associated with the excitation signal ($x_{In}(t)$, the phase difference ($\Delta\phi_{Out}$) of the signals ($x_{Out1}(t)$, $x_{Out2}(t)$) associated with the response signal ($x_{Out}(t)$) and the frequency difference ($\Delta\omega$), wherein the device under test is a frequency-converting functional unit, and wherein the signals ($x_{In1}(t)$, $x_2(t)$) associated with the excitation signal ($x_{In}(t)$ are mixed sequentially to the signals ($x_{Out1}(t)$, $x_{Out2}(t)$) associated with the response signal ($x_{Out}(t)$) into the intermediate frequency band respective into the base band.

2. The method according to claim 1, wherein the device under test is a mixer with integrated local oscillator.

3. The method according to claim 2, wherein the device under test comprises several mixers arranged one after the other in a cascade.

4. The method according to claim 1, wherein each signal ($x_{In1}(t), x_{In2}(t), x_{Out1}(t), x_{Out2}(t)$) contained respectively in the excitation signal ($x_{In}(t)$) and in the response signal ($x_{Out}(t)$) is a sinusoidal, high-frequency signal ($x_{InHF1}(t)$, $x_{InHF2}(t)$, $x_{OutHF1}(t)$, $x_{OutHF2}(t)$) and is mixed into an associated intermediate-frequency sideband signal ($x_{InZF1}(t), x_{InZF2}(t), x_{OutZF1}(t), x_{OutZF2}(t)$), which is mixed, in each case after filtering, into an associated baseband signal ($x_{InBB1}(t), x_{InBB2}(t), x_{OutBB1}(t), x_{OutBB2}(t)$).

5. The method according to claim 4, wherein the phases arg $\{x_{InBB1}(t)\}$, arg $\{x_{InBB2}(t)\}$, arg $\{x_{OutBB1}(t)\}$, arg $(\{x_{OutBB2}(t)\})$ in the baseband signals ($x_{InBB1}(t), x_{InBB2}(t)$, $x_{OutBB1}(t), x_{OutBB2}(t)$) contained in the excitation signal ($x_{In}(t)$) and in the response signal ($x_{Out}(t)$) are detected in the network analyzer in a synchronous manner at the same timing point ($t_0$).

6. The method according to claim 4, wherein the mixing of the sinusoidal, high-frequency signals ($x_{InHF1}(t), x_{InHF2}(t), x_{OutHF1}(t), x_{OutHF2}(t)$) associated respectively with the excitation signal ($x_{In}(t)$)and with the response signal ($x_{Out}(t)$) into an associated intermediate-frequency sideband signal ($x_{InZF1}(t), X_{InZF2}(t), X_{OutZF1}(t), x_{OutZF2}(t)$) is implemented in each case in alternation through a common local oscillator with a switching duration ($\Delta t$).

7. The method according to claim 6, wherein the mixing of the intermediate-frequency sideband signals ($x_{InZF1}(t)$, $x_{InZF2}(t), x_{OutZF1}(t), x_{OutZF2}(t)$) respectively associated with the excitation signal ($X_{In}(t)$) and with the response signal ($x_{Out}(t)$) into an associated baseband signal ($x_{InBB1}(t), X_{InBB2}(t), X_{OutBB1}(t), X_{OutBB2}(t)$) is implemented in each case in alternation through a common local oscillator with a switching duration ($\Delta t$).

8. The method according to claim 6, wherein, in each case in the network analyzer, the phases (arg $\{x_{InBB1}(t)\}$, arg $\{x_{InBB\,2}(t)\}$) of all of the baseband signals ($x_{InBB1}(t), x_{InBB2}(t)$) contained in the excitation signal ($X_{In}(t)$) are detected synchronously at an identical timing point ($t_0$), and the phases (arg$\{x_{OutBB1}(t)\}$) of all baseband signals ($X_{OutBB1}(t), X_{OutBB2}(t)$) contained in the response signal ($x_{Out}(t)$) are detected synchronously at an identical timing point ($t_0+\Delta t$).

9. The method according to claim 4, wherein the sinusoidal, high-frequency signals ($x_{InHF1}(t), x_{InHF2}(t)$) respectively associated with the excitation signal ($x_{In}(t)$) and the sinusoidal high-frequency signals ($X_{OutHF1}(t), X_{OutHF2}(t)$) respectively associated with the response signal ($x_{Out}(t)$) are mixed in alternation with a switching duration ($\Delta t$) in a common measurement channel into an associated intermediate-frequency sideband signal ($X_{InZF1}(t), X_{InZF2}(t), X_{OutZF1}(t), x_{OutZ2}(t)$) and an associated baseband signal ($X_{InBB1}(t), X_{InBB2}(t), X_{OutBB1}(t), X_{OutBB2}(t)$.

10. The method according to claim 4, wherein the filter bandwidth of the filtering in the intermediate-frequency band is larger than a maximal drift ($\Delta\omega'$) of the oscillator frequency of the local oscillator contained in the device under test.

11. The method according to claim 1, wherein every signal ($X_{In1}(t), X_{In2}(t), X_{Out1}(t), X_{Out2}(t)$) contained in each excitation signal ($x_{In}(t)$) and in each response signal ($x_{Out}(t)$) is a sinusoidal, high-frequency signal ($X_{InHF1\,(t)},\,x_{InHF2}(t), X_{OutHF1}(t), X_{OutHF2}(t)$) and is mixed in each case into a signal ($X_{InDown1}(t), X_{InDown2}(t), X_{OutDown1}(t), X_{OutDown2}(t)$) in the intermediate-frequency band or baseband and Fourier transformed.

12. The method according to claim 1, wherein the mixing into the intermediate-frequency band or baseband and the Fourier transformation is implemented respectively for the signals ($x_{In1}(t), x_{In2}(t)$)contained in the excitation signal ($x_{In}(t)$) and for the signals ($x_{out}(t), x_{Out2}(t)$) contained in the response signal ($x_{Out}(t)$) in each case in alternation, within a common measurement channel offset by the switching duration ($\Delta t$).

13. The method according to claim 1, wherein the two signals ($X_{In1}(t), X_{In2}(t)$) of the excitation signal ($X_{In}(t)$) are each generated by a separate signal source integrated in the network analyzer and combined to form the excitation signal ($x_{In}(t)$) via a signal linking unit integrated in the network analyzer.

14. The method according to claim 1, wherein a phase (φ) of the device under test to be measured is determined through time integration of the determined group delay time (τG).

15. The method according to claim 14, wherein a linearized phase is determined for the phase ($\phi$) determined from the group delay time ($\tau G$), and a relative phase ($\phi R$) is determined from the difference between the phase ($\phi$) determined from the group delay time ($\tau G$) and the linearized phase.

16. A network analyzer for measuring a group delay time ($\tau G$) which is caused by a device under test to be measured, comprising:

a signal-generator unit for generating an excitation signal ($x_{In}(t)$) with two high-frequency monotone signals ($x_{In1}(t)$, $x_{In2}(t)$) each with a different frequency, which have a frequency difference ($\Delta\omega$) relative to one another;

a signal splitter for the simultaneous supply of the excitation signal ($x_{In}(t)$) to a first connection of the network analyzer connected to an input of the device under test and to a measurement channel or reference channel;

a second connection of the network analyzer connected to an Output of the device under test for rerOuting a response signal ($x_{Out}(t)$) with two signals ($x_{Out1}(t), x_{Out2}(t)$) associated with the excitation signal ($x_{In}(t)$) and registered at the output of the device under test into a measurement channel within the reference and/or measurement channel, in each case at least one mixer unit for the mixing of the two signals ($x_{Out1}(t), x_{Out2}(t)$) of the excitation signal ($x_{In}(t)$) and of the response signal ($x_{Out}(t)$) respectively into an intermediate-frequency signal and/or baseband signal ($X_{InBB1}(t), X_{InBB2}(t), X_{OutBB1}(t), X_{OutBB2}(t); x_{InDown1}(t), x_{InDown2}(t), x_{OutDown1}(t), x_{OutDown2}(t)$), in each case, two detectors or a Fourier transformer for detecting the phases (arg $\{X_{InBB1}(t)\}$, arg $\{x_{InBB2}(t)\}$, arg $\{x_{OutBB1}(t)\}$, arg $\{x_{OutBB2}(t)\}$; arg $\{x_{InDown1}(t)\}$, arg $\{x_{InDown2}(t)\}$, arg $\{x_{OutDown1}(t)\}$, arg $\{x_{OutDown2}(t)\}$, arg $\{X_{OutBB2}(t)\}$) associated with the respective intermediate-frequency signal or baseband signal ($x_{InBB1}(t), x_{InBB2}(t), x_{OutBB1}(t); x_{OutBB2}(t); x_{InDown1}(t), x_{InDown2}(t), x_{OutDown1}(t), x_{OutDown2}(t)$); and a calculation unit for calculating the group delay time ($\tau G$) from the phases (arg $\{x_{InBB1}(t_0)\}$, arg $\{x_{InBB2}(t_0)\}$, arg $\{x_{OutBB1}(t_0)\}$, arg $\{x_{OutBB2}(t_0)\}$; arg $\{x_{InDown1}(t)\}$, arg $\{x_{InDown2}(t)\}$, arg $\{x_{OutDown1}(t)\}$, arg $\{x_{OutDown2}(t)\}$, arg $\{x_{OutBB2}(t)\}$) of the intermediate-frequency signal or baseband signal ($x_{InBB1}(t), x_{InBB2}(t), X_{OutBB1}(t), X_{OutBB2}(t); x_{InDown1}(t), x_{InDown2}(t), x_{OutDown1}(t), x_{OutDown2}(t)$), wherein the device under test is a frequency-converting functional unit, wherein the signals ($x_{In1}(t), x_{In2}(t)$) associated with the excitation signal ($x_{In}(t)$) are mixed sequentially to the signals ($x_{Out1}(t), x_{Out2}(t)$) associated with the response signal ($x_{Out}(t)$) into the intermediate frequency band respective into the base band.

17. The network analyzer according to claim 16, wherein the signal generator unit comprises two signal sources for the generation in each case of one of the two signals ($x_{In1}(t), x_{In2}(t)$) of the excitation signal ($x_{In}(t)$) and downstream signal-linking unit for combining the two signals ($x_{In1}(t), x_{In2}(t)$) to form the excitation signal ($x_{In}(t)$).

18. The network analyzer according to claim 17, wherein the signal-linking unit is a high-frequency coupler.

19. The network analyzer according to claim 18, wherein the signal-linking unit is a mixer.

* * * * *